United States Patent
Ahn et al.

(10) Patent No.: US 11,980,025 B2
(45) Date of Patent: May 7, 2024

(54) SEMICONDUCTOR DEVICE INCLUDING CARBON-CONTAINING CONTACT FENCE

(71) Applicant: SAMSUNG ELECTRONICS CO., LTD., Suwon-si (KR)

(72) Inventors: Junhyeok Ahn, Suwon-si (KR); Huijung Kim, Seongnam-si (KR); Kiseok Lee, Hwaseong-si (KR); Myeongdong Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 165 days.

(21) Appl. No.: 17/705,991

(22) Filed: Mar. 28, 2022

(65) Prior Publication Data
US 2023/0089688 A1    Mar. 23, 2023

(30) Foreign Application Priority Data
Sep. 23, 2021    (KR) .................. 10-2021-0125870

(51) Int. Cl.
*H10B 12/00*    (2023.01)

(52) U.S. Cl.
CPC ........... *H10B 12/485* (2023.02); *H10B 12/34* (2023.02); *H10B 12/482* (2023.02); *H10B 12/488* (2023.02)

(58) Field of Classification Search
CPC .... H10B 12/34; H10B 12/482; H10B 12/485; H10B 12/488
USPC ........................................................ 257/907
See application file for complete search history.

(56) References Cited

U.S. PATENT DOCUMENTS

| | | | |
|---|---|---|---|
| 9,012,321 B1 | 4/2015 | Kim et al. | |
| 9,245,849 B2 | 1/2016 | Park et al. | |
| 9,269,720 B1 | 2/2016 | Bae et al. | |
| 9,390,961 B2 | 7/2016 | Lee et al. | |
| 10,777,559 B1 | 9/2020 | Wu et al. | |
| 10,790,150 B2 | 9/2020 | Kim et al. | |
| 10,957,647 B2 | 3/2021 | Lee et al. | |
| 10,957,699 B2 | 3/2021 | Ito | |
| 10,978,397 B2 | 4/2021 | Kim et al. | |
| 2015/0132942 A1 | 5/2015 | Kim et al. | |
| 2020/0273862 A1* | 8/2020 | Wu ................... | H10B 12/0335 |
| 2020/0365537 A1 | 11/2020 | Choi et al. | |

(Continued)

FOREIGN PATENT DOCUMENTS

KR    10-1733771 B1    5/2017
KR    10-2017-0103204 A    9/2017

OTHER PUBLICATIONS

Office Action in Taiwanese Appln. No. 111123780, dated May 2, 2023, 17 pages (with machine translation).

*Primary Examiner* — Hoai V Pham
(74) *Attorney, Agent, or Firm* — Fish & Richardson P.C.

(57) ABSTRACT

A semiconductor device includes; an active region defined by an isolation film on a substrate, a word line in the substrate, the word line extending in a first direction and crossing the active region, a bit line above the word line and extending in a second direction, a contact between bit lines adjacent in the first direction, the contact connecting the active region and extending in a vertical direction, and a contact fence disposed on each of opposing side surfaces of the contact in the second direction and extending in the vertical direction, wherein the active region has a bar shape extending oblique to the first direction, and the contact fence includes a carbon-containing insulating film.

17 Claims, 32 Drawing Sheets

(56) References Cited

U.S. PATENT DOCUMENTS

2020/0388618 A1 12/2020 Ikeda
2021/0202492 A1 7/2021 Wang et al.

* cited by examiner

SEMICONDUCTOR DEVICE INCLUDING CARBON-CONTAINING CONTACT FENCE

CROSS-REFERENCE TO RELATED APPLICATION

This application claims priority under 35 U.S.C. § 119 to Korean Patent Application No. 10-2021-0125870 filed on Sep. 23, 2021 in the Korean Intellectual Property Office, the subject matter of which is hereby incorporated by reference in its entirety.

BACKGROUND

The inventive concept relates to semiconductor devices, and more particularly, to semiconductor devices including a carbon-containing contact fence.

With the increase in the integration density of semiconductor devices, design rules for semiconductor device components have been reduced. Accordingly, the formation of a contact connecting an interconnection line to an active region in highly scaled semiconductor devices has become increasingly complex and difficult. For example, the space (or area) allocated to a contact in highly scaled semiconductor devices has been notably narrowed, and thus, it is increasingly difficult to perform an etching process in relation to the narrow space. Accordingly, the possibility of misalignments between contacts and active regions has increased, wherein such misalignments tend to reduce manufacturing productivity and yield.

SUMMARY

Embodiments of the inventive concept provide semiconductor devices and related methods of manufacture that better facilitate etching process(es) during contact formation. As a result, semiconductor devices according to embodiments of the inventive concept provide contacts exhibiting improved resistance characteristics.

According to an aspect of the inventive concept, a semiconductor device may include; an active region defined by an isolation film on a substrate, a word line in the substrate, the word line extending in a first direction and crossing the active region, a bit line above the word line and extending in a second direction, a contact between bit lines adjacent in the first direction, the contact connecting the active region and extending in a vertical direction, and a contact fence disposed on each of opposing side surfaces of the contact in the second direction and extending in the vertical direction, wherein the active region has a bar shape extending oblique to the first direction and the contact fence includes a carbon-containing insulating film.

According to an aspect of the inventive concept, a semiconductor device may include; an active region defined by an isolation film on a substrate, a word line in the substrate, the word line extending in a first direction and crossing the active region, a bit line disposed above the word line and extending in a second direction, a contact between bit lines adjacent in the first direction, the contact being connected to the active region and extending in a vertical direction, and a contact fence on each of opposing side surfaces of the contact in the second direction and extending in the vertical direction, wherein the active region has a bar shape extending oblique to the first direction, and the contact fence includes a center fence including a silicon nitride (SiN) film and an outer fence including a carbon-containing insulating film.

According to an aspect of the inventive concept, a semiconductor device may include; an active region defined by an isolation film on a substrate, a word line in the substrate, the word line extending in a first direction and crossing the active region, a bit line disposed above the word line and extending in a second direction, a contact between bit lines adjacent in the first direction, the contact being connected to the active region and extending in a vertical direction, and a contact fence on each of opposing side surfaces of the contact in the second direction and extending in the vertical direction, wherein the active region has a bar shape extending oblique to the first direction, and the contact fence includes a carbon-containing single insulating film.

BRIEF DESCRIPTION OF THE DRAWINGS

Certain advantages and features, as well as the making and use, of the inventive concept may be more clearly understood upon consideration of the following detailed description together with the accompanying drawings, in which.

DETAILED DESCRIPTION

Throughout the written description and drawings. like reference numbers and labels are used to denote like or similar elements, components method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1A:
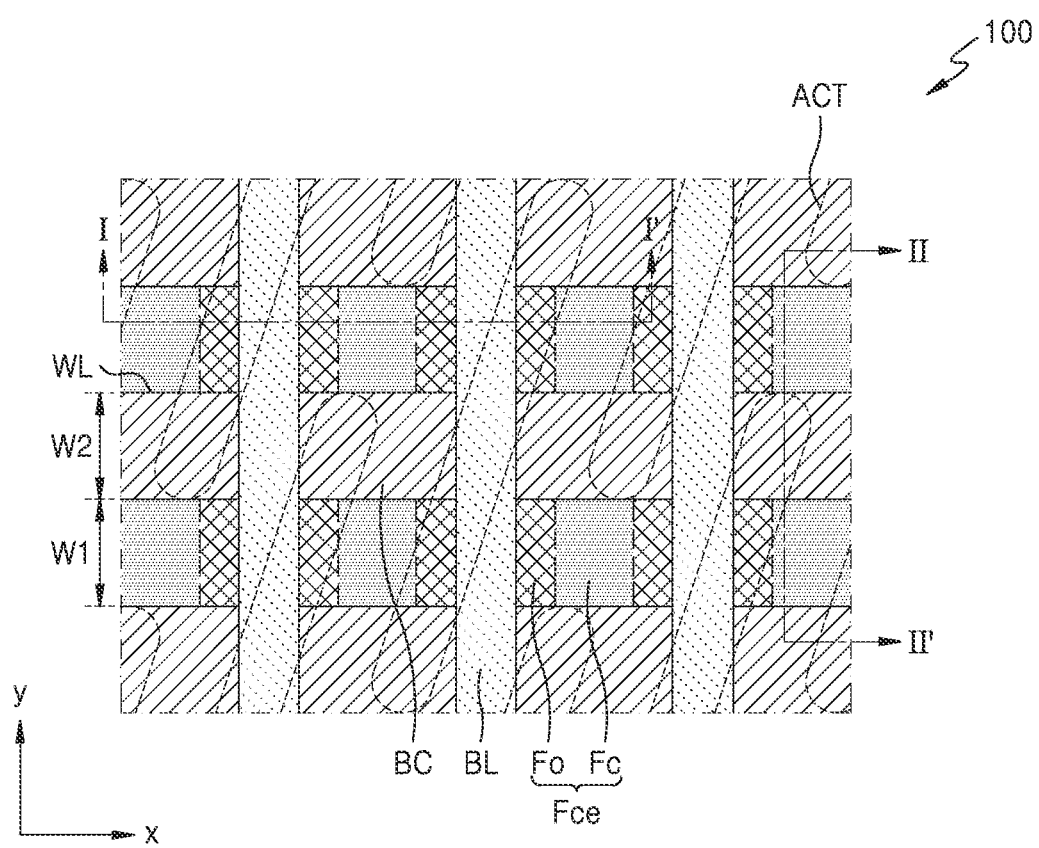
FIGS. 1A, 1B and 1C are respective plan (or top-down) or cross-sectional views of a semiconductor device including a carbon-containing contact fence according to embodiments of the inventive concept.
Figure 1B:
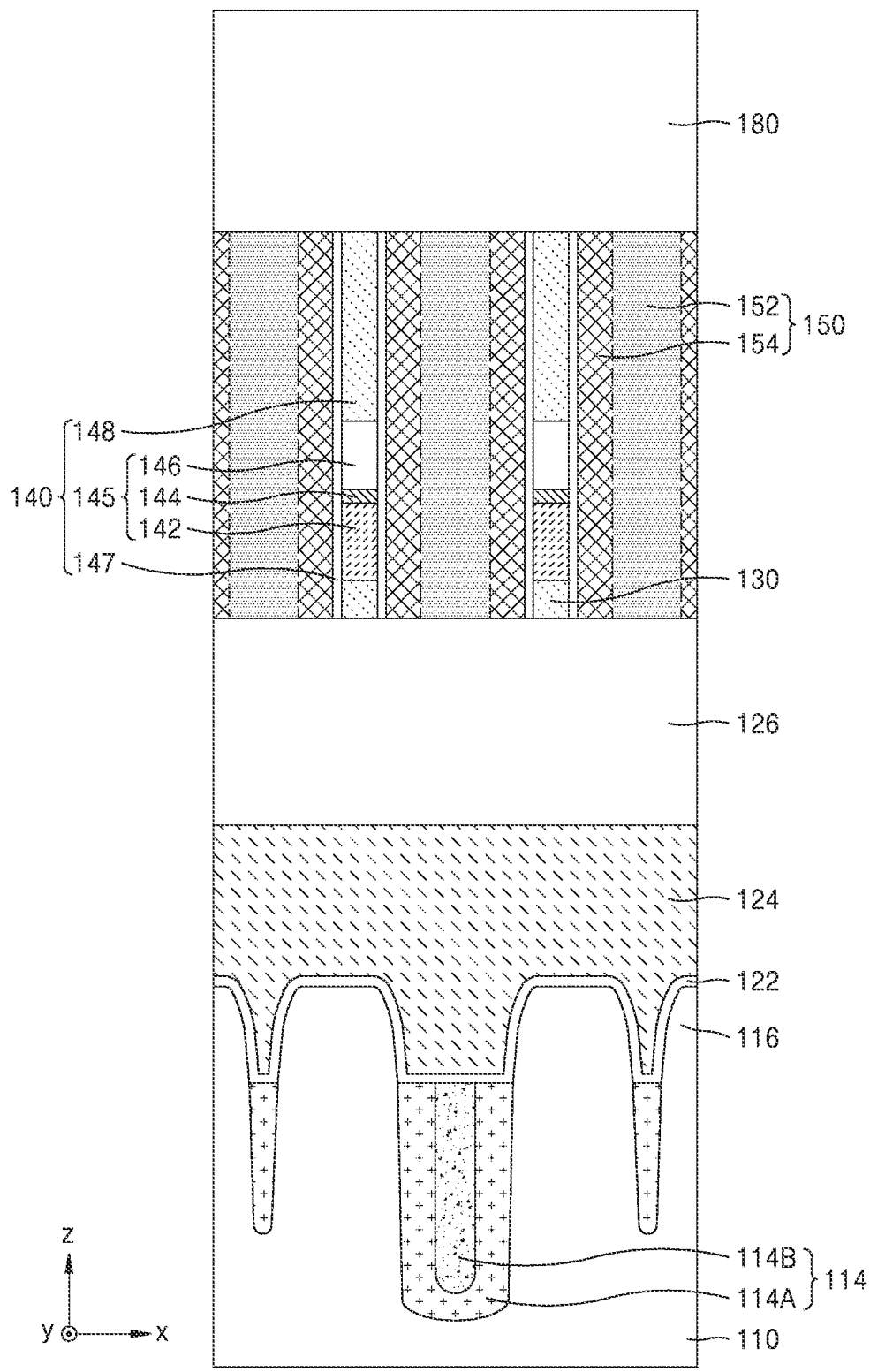
Figure 1C:
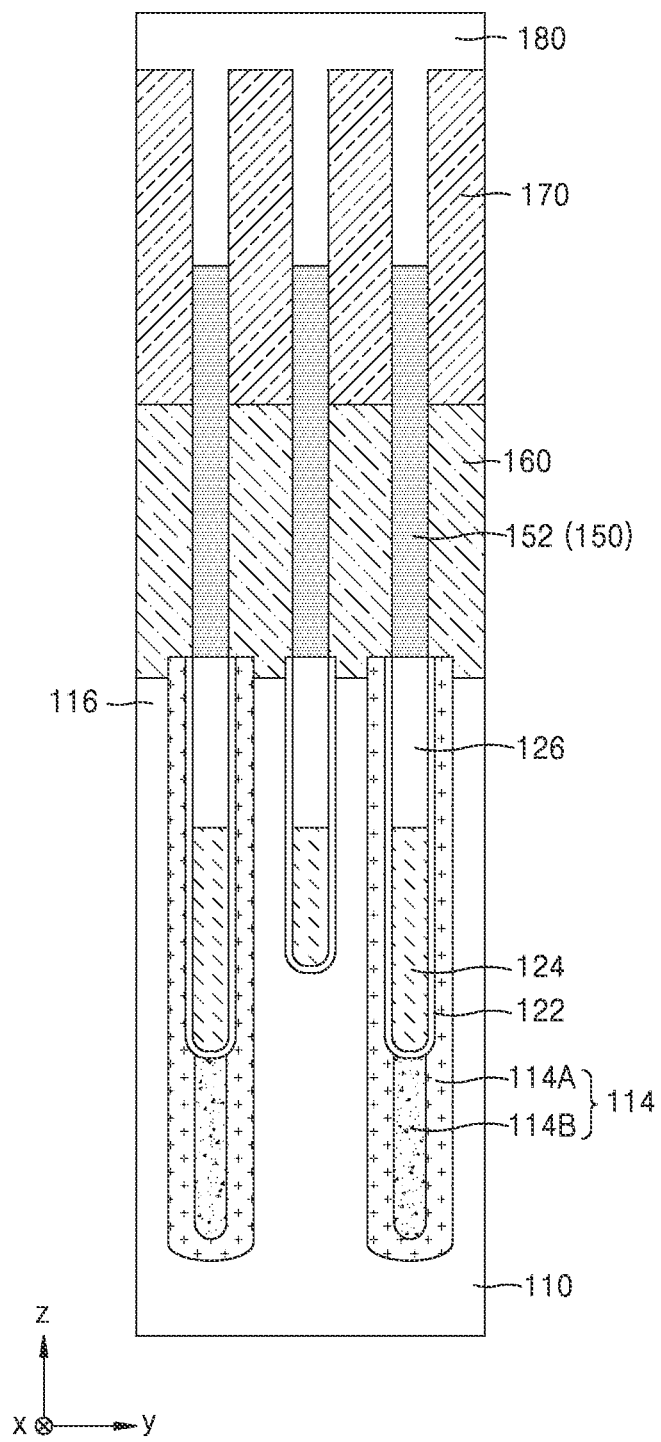

FIG. 1A is a plan view of a semiconductor device 100 including a carbon-containing contact fence according to embodiments of the inventive concept, FIG. 1B is a cross-sectional view taken along line I-I' of FIG. 1A, and FIG. 1C is a cross-sectional view taken along line II-IT of FIG. 1A.

Referring to FIG. 1A, the semiconductor device 100 may include a number of active regions ACT. Here, the active regions ACT (see 116 in FIG. 1B) may be defined by an isolation film (114 in FIG. 1B) formed in a substrate (110 in FIG. 1B). With a decrease in design rules, the active regions ACT may have a diagonal or an oblique bar shape, as shown in FIG. 1A.

The semiconductor device 100 further includes word lines WL extending in parallel in a first horizontal (or X-) direction (hereafter, "first direction"). The word lines WL may cross the active regions ACT and have a buried structure with respect to the substrate 110. The word lines WL may be spaced apart (e.g., arranged at regular, separated intervals) in a second horizontal (or Y-) direction intersecting the first direction (hereafter, "second direction").

The semiconductor device 100 may include bit lines BL extending in parallel in the second direction. The bit lines BL may be disposed at a level above that of the word lines WL. (In this regard, the term "level" denotes a location or disposition (e.g., measured in a vertical (or Z-) direction substantially orthogonal to the first and second directions relative to an arbitrarily selected horizontal plane). The bit lines BL may be arranged at regular intervals in the first direction. Because the word lines WL have the buried structure in a cell region of the semiconductor device 100, the bit lines BL in the cell region may be disposed at the same level as a word line in a peripheral region or a core region. In this regard, the bit lines BL may be referred to as global bit lines.

The semiconductor device 100 may include various types of contacts (e.g., direct contacts (not shown), buried contacts BC (see 160 in FIG. 1C), landing pads (170 in FIG. 1C)) formed above the active regions ACT. Here, for example, a direct contact may connect an active region ACT to a bit line BL and be disposed at an intersection between the active region ACT and the bit line BL. A buried contact BC may connect the active region ACT to the lower electrode (not shown) of a capacitor. Similar to the bit lines BL, the buried contacts BC may be referred to as global buried contacts. In general, an overlapping area between the buried contact BC and the lower electrode of the capacitor may be small due to the planar layout structure thereof. Accordingly, to increase the overlapping area and the contact area between the buried contact BC and the lower electrode of the capacitor, a landing pad 170 may be between the buried contact BC and the lower electrode of the capacitor. When the contact area between the buried contact BC and the lower electrode of the capacitor is increased by the interposition of the landing pad 170, the contact resistance between the active region ACT and the lower electrode of the capacitor may be decreased.

A word line WL may have a structure buried in the substrate 110 of the semiconductor device 100 and may cross the active region ACT between the direct contact and the buried contact BC. As shown in FIG. 1A, two word lines WL may cross a single active region ACT, wherein the active region ACT is arranged in a diagonal direction. Accordingly, the active region ACT may form (or be disposed at) an acute angle with respect to a word line WL.

Direct contacts and buried contacts BC may be arranged in lines in the first and second directions. A contact fence Fce (see 150 in FIG. 1B) may be between two adjacent buried contacts BC in the second direction. The contact fence Fce may overlap with the word line WL. That is, the contact fence Fce may be vertically disposed above the word line WL on the top surface of the substrate 110 and between two adjacent bit lines BL. The contact fence Fce may have a first width W1 in the second direction, and a buried contact BC may have a second width W2 in the second direction. Here, the first width W1 may be the same as, or different from the second width W2. In some embodiments, the first width W1 may be substantially the same as the second width W2 in the semiconductor device 100.

The contact fence Fce may include a center fence Fc (see 152 in FIG. 1B) in a central portion thereof and an outer fence Fo (see 154 in FIG. 1B) on opposing side surfaces of the center fence Fc. In the semiconductor device 100, the center fence Fc may include an insulating film, such as for example, a nitride film or a silicon nitride (SiN) film. However, the composition of the center fence Fc is not limited to only the SiN film. The outer fence Fo may include a carbon (C)-containing insulating film. For example, the outer fence Fo may include for example, a silicon oxide carbon (SiOC) film or a silicon oxide carbon nitride (SiOCN) film. However, the composition of the outer fence Fo is not limited to only these materials.

The structure of the semiconductor device 100 will now be described in some additional detail with reference to FIGS. 1B and 1C.

Referring to FIGS. 1A, 1B and 1C, the semiconductor device 100 may include an active region 116 defined by an isolation film 114 in the substrate 110. As shown in FIG. 1A, the active region 116 may have a bar shape forming (or arranged at) an acute angle with respect to the first direction. The substrate 110 may include at least one of, for example, silicon (Si), germanium (Ge), silicon germanium (SiGe), silicon carbide (SiC), gallium arsenide (GaAs), indium arsenide (InAs), and indium phosphide (InP). In some embodiments, the substrate 110 may include a conductive region (e.g., an impurity-doped well, an impurity-doped region, and/or an impurity-doped structure).

The isolation film 114 may include a single-insulating film structure or a structure including an outer insulating film 114A and an inner insulating film 114B. The outer insulating film 114A may include a different material than the inner insulating film 114B. For example, the outer insulating film 114A may include an oxide film, and the inner insulating film 114B may include a nitride film. However, the structure and composition of the isolation film 114 may vary by design.

The semiconductor device 100 may include a word line 124 having a buried structure in the substrate 110. For example, the top surface of the word line 124 may be lower than (e.g., disposed at a lower level than) the top surface of the substrate 110. That is, the word line 124 may be in a lower portion of a trench, and a gate insulating film 122 may be on the bottom surface of the word line 124. A buried insulating film 126 may be on the top surface of the word line 124 in the trench. As shown in FIGS. 1B and 1C, the word line 124 may be arranged deep in the isolation film 114 and thin in the active region 116. For example, the word line 124 may include at least one material selected from titanium (Ti), titanium nitride (TiN), tantalum (Ta), TaN, tungsten (W), WN, TiSiN, and WSiN. For example, the gate insulating film 122 may include at least one of, for example $SiO_2$, SiN, SiON, oxide/nitride/oxide (ONO), and a high-k dielectric film having a dielectric constant greater than $SiO_2$. The top surface of the buried insulating film 126 may be substantially at the same level as the top surface of the substrate 110. The buried insulating film 126 may include $SiO_2$, SiN, SiON, or a combination thereof.

Word lines 124 may extend in the first direction and be separated from each other in the second direction. As shown in FIG. 1A, a word line 124 may cross the active region 116 at an acute angle, and two word lines 124 may cross a single active region 116. The active region 116 at each of the both sides of the word line 124 may form a source/drain region and may include high-concentration impurity ions. A central portion of the active region 116 may form a common source region and be connected to a direct contact. Both outer portions of the active region 116 may form drain regions and be connected to a buried contact 160.

The semiconductor device 100 may include bit line structures 140 on the substrate 110. The bit line structures 140 may extend in the second direction and be separated from each other in the first direction. Each of the bit line structures 140 may include a bit line 145, a capping insulating film 148, and a spacer 147. In some embodiments, the bit line 145 may include at least one of, for example, an impurity-doped semiconductor film, a metal film, a metal nitride film, and a metal silicide film. The bit line 145 may include multiple films. For example, the bit line 145 may have a stack structure, in which a polysilicon film 142, a WN film 144, and a W film 146 are sequentially stacked. In some embodiments, the bit line 145 may include a single conductive film. The bit line 145 may be connected to the active region 116 through a direct contact passing through an interlayer insulation film 130.

The capping insulating film 148 may be on the bit line 145 and include, for example, an SiN film. The spacer 147 may cover respective side surfaces of the bit line 145 and the capping insulating film 148. The spacer 147 may have a single-film structure or a multi-film structure. For example, the spacer 147 may have a multi-film structure and include first to third spacers. Here, the first and third spacers may include an SiN film, and the second spacer may include an $SiO_2$ film. However, the multi-film structure of the spacer 147 and the materials of multiple films are not limited to only those described above.

The semiconductor device 100 may include a contact fence 150 above the substrate 110. The contact fence 150 may be on the buried insulating film 126 on the word line 124. The contact fence 150 may be between two adjacent bit line structures 140 in the first direction and between two adjacent buried contacts 160 in the second direction. The contact fence 150 may include a center fence 152 and an outer fence 154. For example, the center fence 152 may include an SiN film. The outer fence 154 may include a carbon-containing insulating film (e.g., an SiOC film or an SiOCN film). The contact fence 150 may insulate the buried contacts 160 from each other in the second direction.

As shown in FIG. 1C, the contact fence 150 may have a substantially regular shape with upper and lower portions having a substantially uniform width in the second direction. However, the cross-section of the contact fence 150 is not limited thereto. Various cross-sectional structures of the contact fence 150 will be described hereafter in some additional detail with reference to FIGS. 2A to 2E.

The semiconductor device 100 may include a buried contact 160 on the substrate 110. The buried contact 160 may be between the bit line structures 140 in the first direction and between two adjacent contact fences 150 in the second direction. The buried contact 160 may include a polysilicon film. The polysilicon film may include an impurity-doped polysilicon film. In some embodiments, the buried contact 160 may include a metal film, a metal silicide film, a metal nitride film, or a combination thereof. The buried contact 160 may have a structure, which includes a barrier film (not shown) and a conductive film on the barrier film. In some embodiments, the barrier film may have a stack structure of Ti/TiN. When the buried contact 160 includes a metal film, a metal silicide film may be between the buried contact 160 and the active region 116. For example, the metal silicide film may include a cobalt silicide ($CoSi_x$) film. However, the metal silicide film is not limited to only the $CoSi_x$ film.

The buried contact 160 may be connected to the active region 116. As shown in FIG. 1C, the bottom surface of the buried contact 160 may be lower than the top surface of the active region 116. However, in some embodiments, the bottom surface of the buried contact 160 may be substantially at the same level as the top surface of the active region 116.

The semiconductor device 100 may include a landing pad 170 on the buried contact 160. The landing pad 170 may include a metal silicide film which is in contact with the buried contact 160. For example, the metal silicide film may include a $CoSi_x$ film. However, the metal silicide film is not limited to only the $CoSi_x$ film. The landing pad 170 may include a barrier film and a metal film on the barrier film. In some embodiments, the barrier film may have a stack structure of Ti/TiN. In some embodiments, the metal film may include a W film.

An upper insulating film 180 and a capacitor (not shown) may be on the contact fence 150 and the landing pad 170. The upper insulating film 180 may include an oxide film or a nitride film. The lower electrode of the capacitor may pass through the upper insulating film 180 and be electrically connected to the landing pad 170.

The outer fence 154 of the contact fence 150 of the semiconductor device 100 includes a carbon-containing insulating film and may thus be partially etched during an etching process for the formation of the buried contact 160 because of an etch rate difference between the outer fence 154 and an adjacent SiN film. Accordingly, the etching process associated with the formation of the buried contact 160 of the semiconductor device 100 may be more readily performed because the outer fence 154 is partially etched. In addition, because the size of the buried contact 160 is increased by partially etching the outer fence 154, the resistance characteristic of the buried contact 160 may be improved. The partial etching of the outer fence 154 of the contact fence 150 will be described hereafter in some additional detail with reference to FIGS. 4A to 9B. Furthermore, a carbon-containing insulating film used as the contact fence 150 of the semiconductor device 100 may have a low permittivity and thus has excellent insulation properties to further reduce parasitic capacitance. For example, when an SiOC film having a low permittivity ranging from about 4.2 to about 4.9 is used as the contact fence 150, the insulation properties between buried contacts 160 may be enhanced and parasitic capacitance decreased.

FIGS. 2A to 2E are cross-sectional views illustrating various structures that may be used in relation to the contact fence of the semiconductor device of FIG. 1C. Here, only relevant portions of the various structures associated with the contact fence are shown.

Figure 2A:
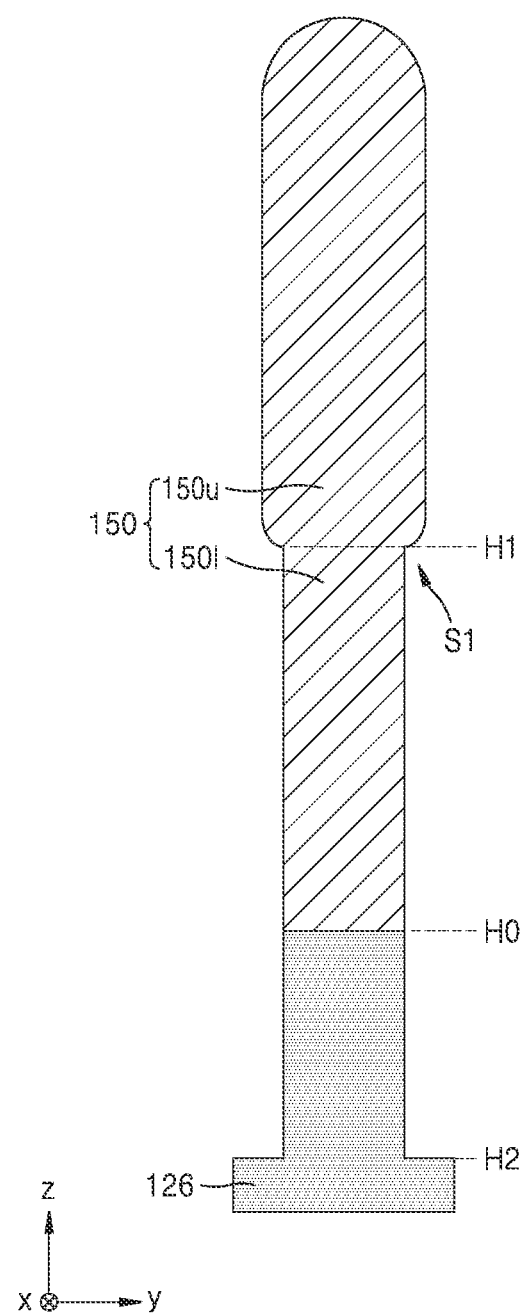
FIGS. 2A, 2B, 2C, 2D and 2E (hereafter collectively, "FIGS. 2A to 2E") are respective cross-sectional views illustrating various a contact fences that may be used in the semiconductor device of FIG. 1C.

Referring to FIG. 2A, the contact fence 150 of the semiconductor device 100 may include a lower portion 150l and an upper portion 150u, wherein a width of the lower portion 150l of the contact fence 150 may be less than a width of the upper portion 150u of the contact fence 150 in the second direction. Accordingly, a first step S1 may be formed in the border between the lower and upper portions 150l and 150u of the contact fence 150.

The structure of the contact fence 150 may result from removing an upper portion of a polysilicon film when a buried contact 160 is formed. That is, the buried contact 160 may be formed by forming a space for the buried contact 160 after the contact fence 150 is formed and filling the space with a polysilicon film. Thereafter, the upper portion of the polysilicon film may be removed by an etching process such as etch back, and the landing pad 170 is formed by filling the etched portion with a metal film. In some embodiments, a metal silicide film may be formed between the polysilicon film and the metal film. During the process of removing the upper portion of the polysilicon film, an upper side surface of the contact fence 150 may also be partially removed and made thinner. Accordingly, the illustrated structure of the contact fence 150 may be obtained by additionally forming an SiN film on the upper portion of the contact fence 150 to a certain thickness.

As shown in FIG. 2A, a bottom end of the lower portion 150l of the contact fence 150 may contact the buried insulating film 126 on the word line 124. In some embodiments, the bottom end of the lower portion 150l of the contact fence 150 may be inserted into the buried insulating film 126. Here, the top surface of the buried insulating film 126 may be at a reference level H0 that is substantially the same as the level of the top surface of the active region 116. A first level H1 corresponding to the first step S1 may correspond to a level at which the metal film or the metal silicide film is formed. Here, the metal silicide film may include, for example, a $CoSi_x$ film. A second level H2 may correspond to the level of the bottom end of the buried contact 160.

Figure 2B:
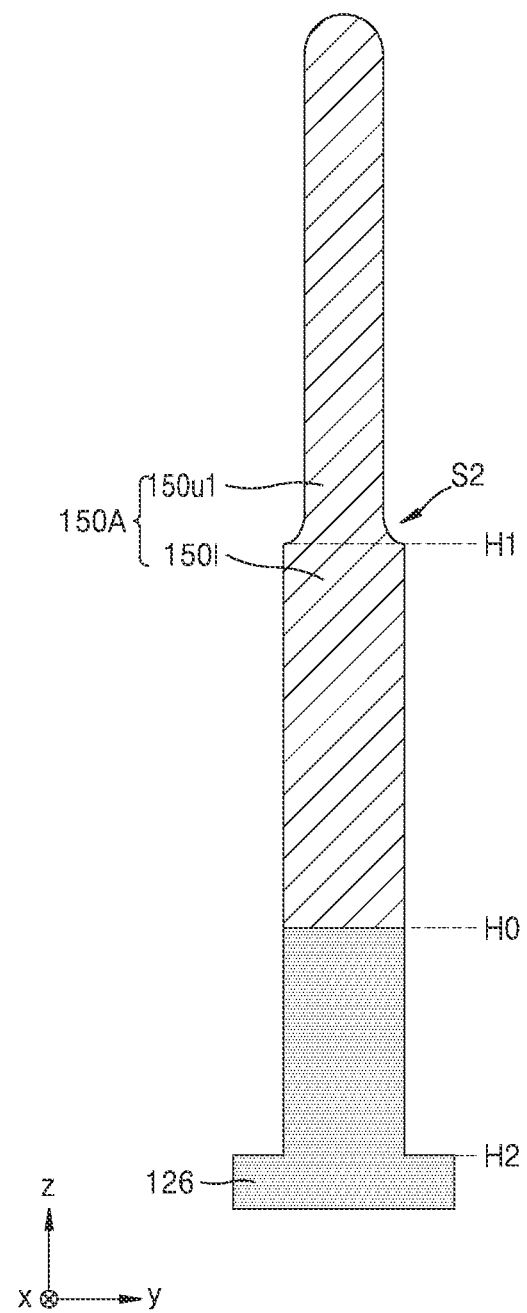

Referring to FIG. 2B, a contact fence 150A of the semiconductor device 100 may include the lower portion 150l and an upper portion 150u1. The width of the lower portion 150l of the contact fence 150A may be greater than a width of the upper portion 150u1 of the contact fence 150A in the second direction. Accordingly, a second step S2 may be formed in the border between the lower and upper portions 150l and 150u1 of the contact fence 150A. The structure of the contact fence 150A may be obtained when an SiN film is not additionally formed on the contact fence 150 that is made thinner after a process of removing the upper portion of the polysilicon film of the buried contact 160.

Figure 2C:
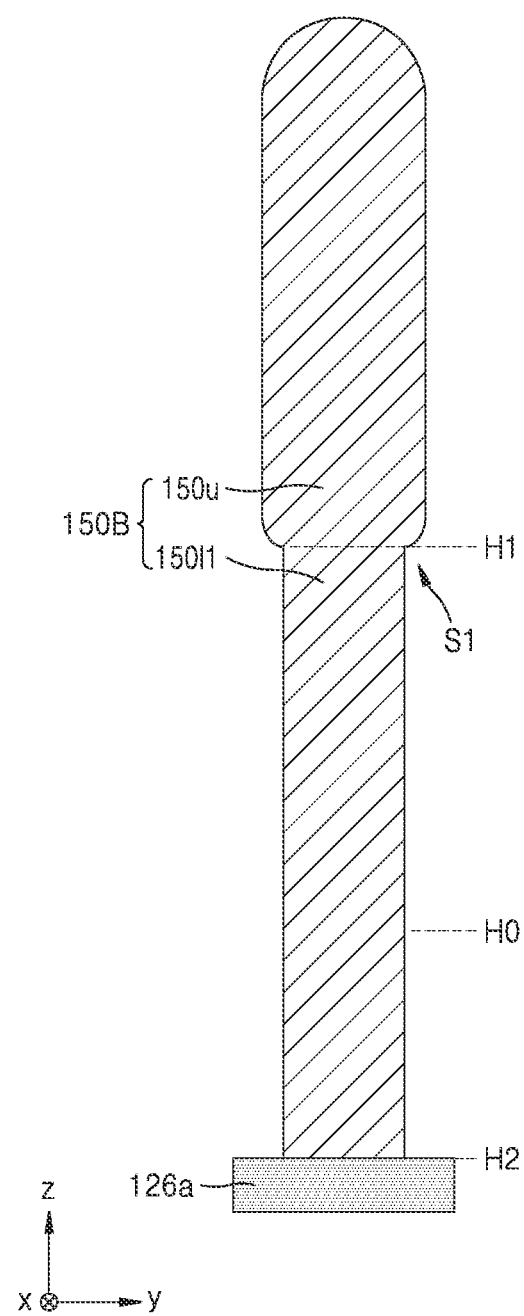

Referring to FIG. 2C, the structure of a contact fence 150B of the semiconductor device 100 may be substantially similar to that of the contact fence 150 in FIG. 2A. For example, the contact fence 150B may include a lower portion 150l and the upper portion 150u. A width of the lower portion 150l of the contact fence 150B may be less than the width of the upper portion 150u of the contact fence 150B in the second direction. Accordingly, the first step S1 may be formed in the border between the lower and upper portions 150l and 150u of the contact fence 150B. However, the contact fence 150B may have a structure, in which the bottom end of the lower portion 150l extends below the reference level H0. That is, the top surface of a buried insulating film 126a may be at the second level H2 that is lower than the reference level H0, and the bottom end of the lower portion 150l of the contact fence 150B may contact the top surface of the buried insulating film 126a. In some embodiments, the bottom end of the lower portion 150l of the contact fence 150B may be inserted into the buried insulating film 126a.

The structure of the contact fence 150B may result from forming the contact fence 150B in an embossed structure. Here, the embossed structure may be implemented by forming a material film for a certain pattern and patterning the material film to form the certain pattern. In contrast, an engraved structure may be implemented by forming a sacrificial film, forming a trench in the sacrificial film using patterning, filling the trench with a material film, and removing the sacrificial film to form a certain pattern.

In the case of the embossed structure, a process of removing an insulating film on the active region 116 may be performed before the material film is formed, and an upper portion of the buried insulating film 126a may be partially removed during the process of removing the insulating film, and accordingly, the top surface of the buried insulating film 126a may be at the second level H2 that is lower than the reference level H0. As a result, in the embossed structure of the contact fence 150B, the bottom end of the lower portion 150l may extend to the second level H2 that is lower than the reference level H0. In some embodiments, the contact fences 150 and 150A in FIGS. 2A and 2B may be formed in an engraved structure.

Figure 2D:
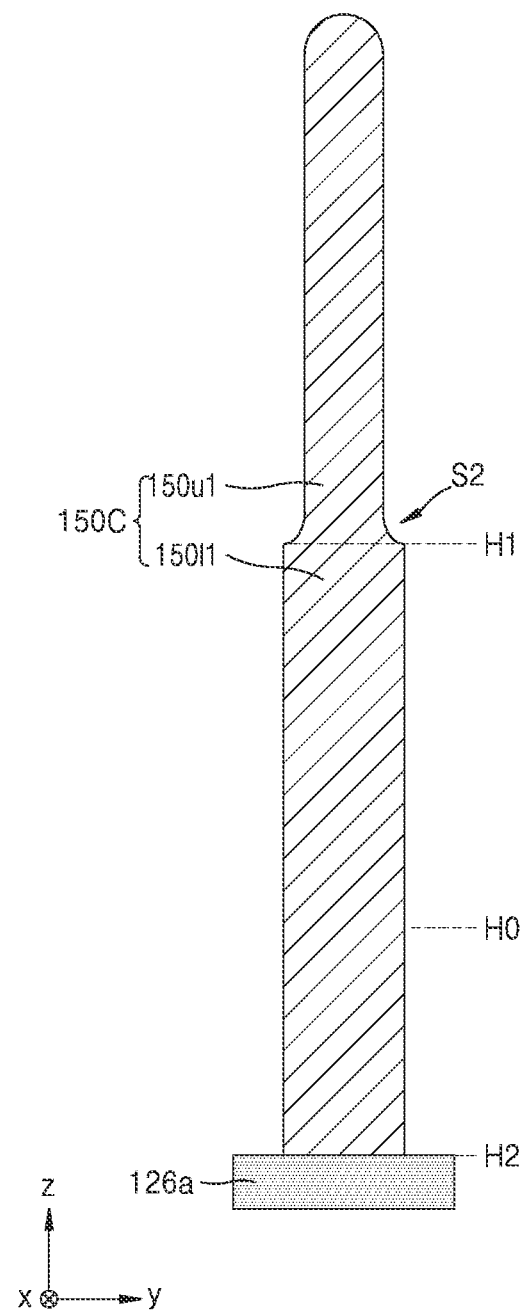

Referring to FIG. 2D, the structure of the contact fence 150C of the semiconductor device 100 may be substantially similar to that of the contact fence 150A in FIG. 2B. For example, the contact fence 150C may include the lower portion 150l and the upper portion 150u1. The width of the lower portion 150l of the contact fence 150C may be greater than the width of the upper portion 150u1 of the contact fence 150C in the second direction. Accordingly, the second step S2 may be formed in the border between the lower and upper portions 150l and 150u1 of the contact fence 150C. However, the contact fence 150C may have a structure, in which the bottom end of the lower portion 150l extends to the second level H2 that is lower than the reference level H0. The structure of the contact fence 150C may result from forming the contact fence 150C in an embossed structure.

Figure 2E:
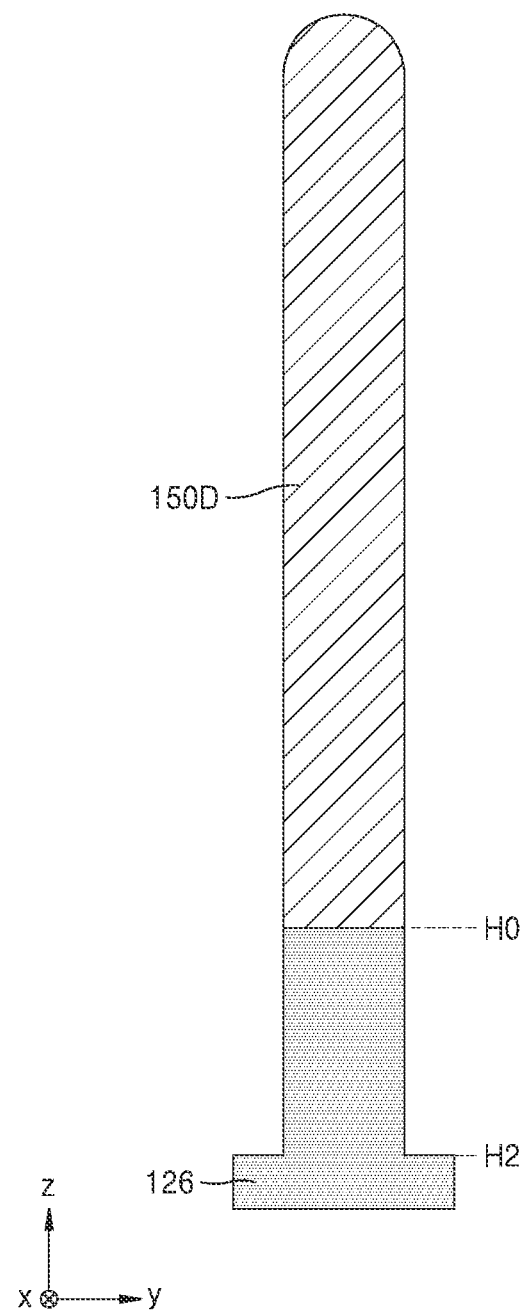

Referring to FIG. 2E, upper and lower portions of a contact fence 150D of the semiconductor device 100 may have a uniform width in the second direction. However, in some embodiments, the contact fence 150D may have a width that increases upwardly in the vertical direction. The structure of the contact fence 150D may result from forming the buried contact 160 with a metal film. That is, when the buried contact 160 is formed by filling a space for the buried contact 160 with only a metal film, a process of removing an upper portion of a polysilicon film may be omitted. Accordingly, the upper portion of the contact fence 150D, rather than being thinner, may have the same width as the lower portion thereof.

Figure 3A:
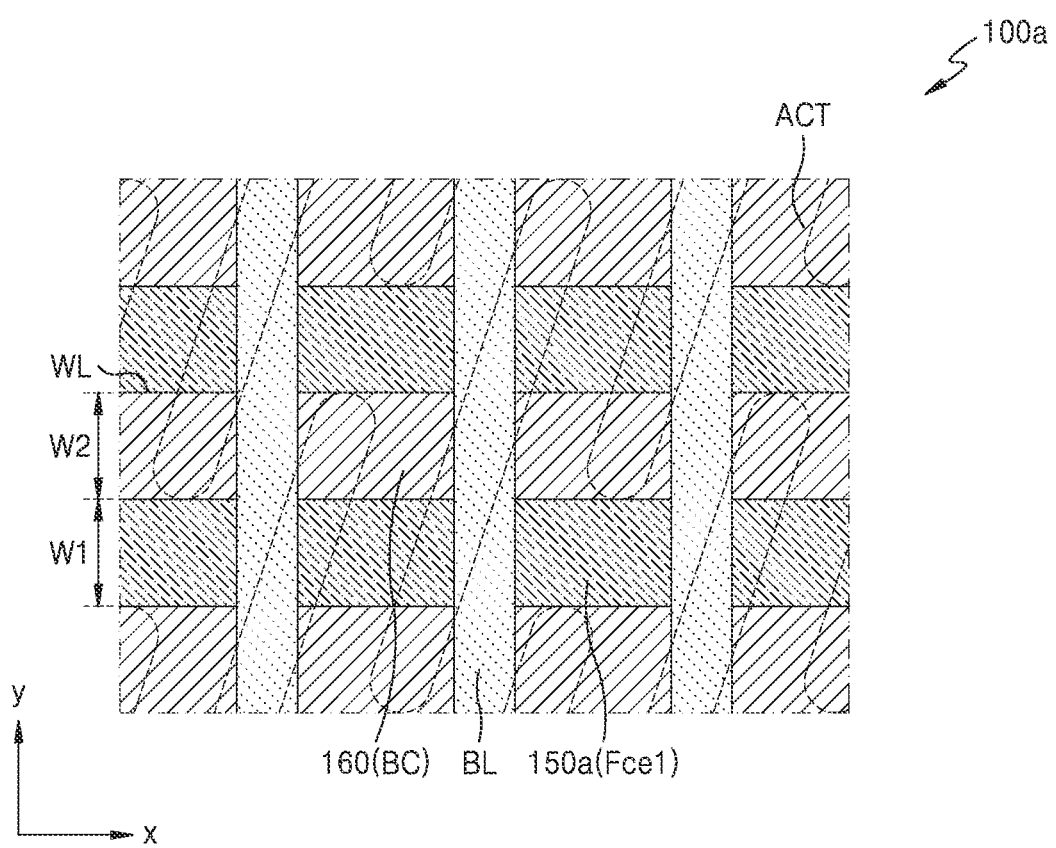
FIGS. 3A and 3B are respective plan views of semiconductor devices including a carbon-containing contact fence according to embodiments of the inventive concept.
Figure 3B:
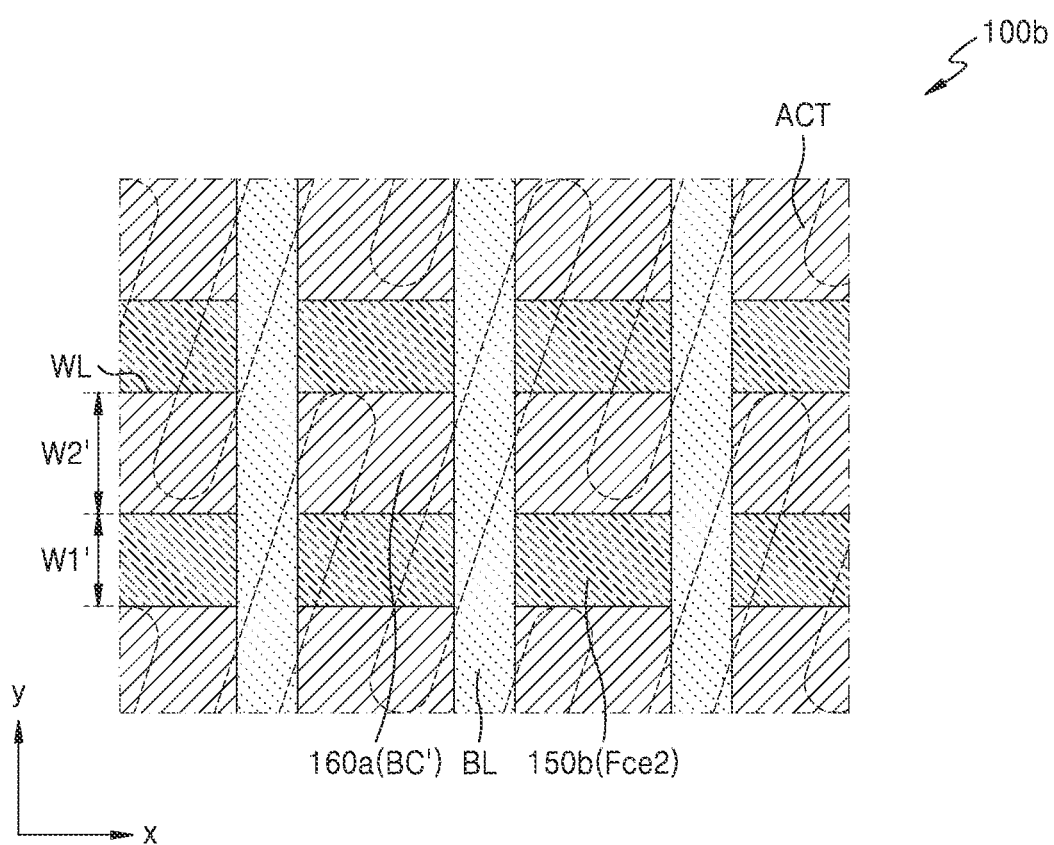

FIGS. 3A and 3B are plan views of semiconductor devices including a carbon-containing contact fence according to embodiments of the inventive concept.

Referring to FIG. 3A in the context of FIGS. 1A, 1B, 1C, and 2A to 2E, a semiconductor device 100a may be different from the semiconductor device 100 of FIG. 1A in that a contact fence 150a or a contact fence Fce1 includes a carbon-containing single insulating film. That is, in the semiconductor device 100a, the contact fence 150a may include a carbon-containing single insulating film (e.g., an SiOC film or an SiOCN film). Accordingly, the contact fence 150a need not be divided into a center fence and an outer fence. In the semiconductor device 100a, the contact fence 150a may have the first width W1 in the second direction, and the buried contact 160 or the buried contact BC may have the second width W2 in the second direction. The first width W1 may be substantially the same as the second width W2. A method of manufacture for the semiconductor device 100a will be described hereafter with reference to FIGS. 10 to 14.

Referring to FIG. 3B, a semiconductor device 100b may be substantially similar to the semiconductor device 100a of FIG. 3A in that a contact fence 150b or a contact fence Fce2 includes a carbon-containing single insulating film. However, the semiconductor device 100b may be different from the semiconductor device 100a of FIG. 3A in that a width of a buried contact 160a or a buried contact BC' may be greater in the second direction than a width of the buried contact 160 of the semiconductor device 100a of FIG. 3A.

That is, in the semiconductor device 100b, the contact fence 150b may include a carbon-containing single insulating film (e.g., an SiOC film or an SiOCN film). The contact fence 150b need not be divided into a center fence and an outer fence. In the semiconductor device 100b, the contact fence 150b may have a first width W1' in the second direction, and the buried contact 160a may have a second width W2' in the second direction, wherein the second width W2' may be greater than the first width W1'. As a result, the buried contact 160a of the semiconductor device 100b may be larger in size than the buried contact 160 of the semiconductor device 100a of FIG. 3A. A method of manufacture for the semiconductor device 100b will be described hereafter with reference to FIGS. 10 to 14 and FIGS. 15A to 18B.

FIGS. 4A to 9B are various plan views illustrating a method of manufacture for the semiconductor device 100 of FIG. 1A in the context of a method of manufacture for a comparative semiconductor device. In this regard, FIGS. 4A, 5, 6A, 7A, 8, and 9A are plan views illustrating the method of manufacture for the semiconductor device 100 of FIG. 1A, and FIGS. 4B, 6B, 7B, and 9B are plan views illustrating the method of manufacture for the comparative semiconductor device.

Figure 4A:
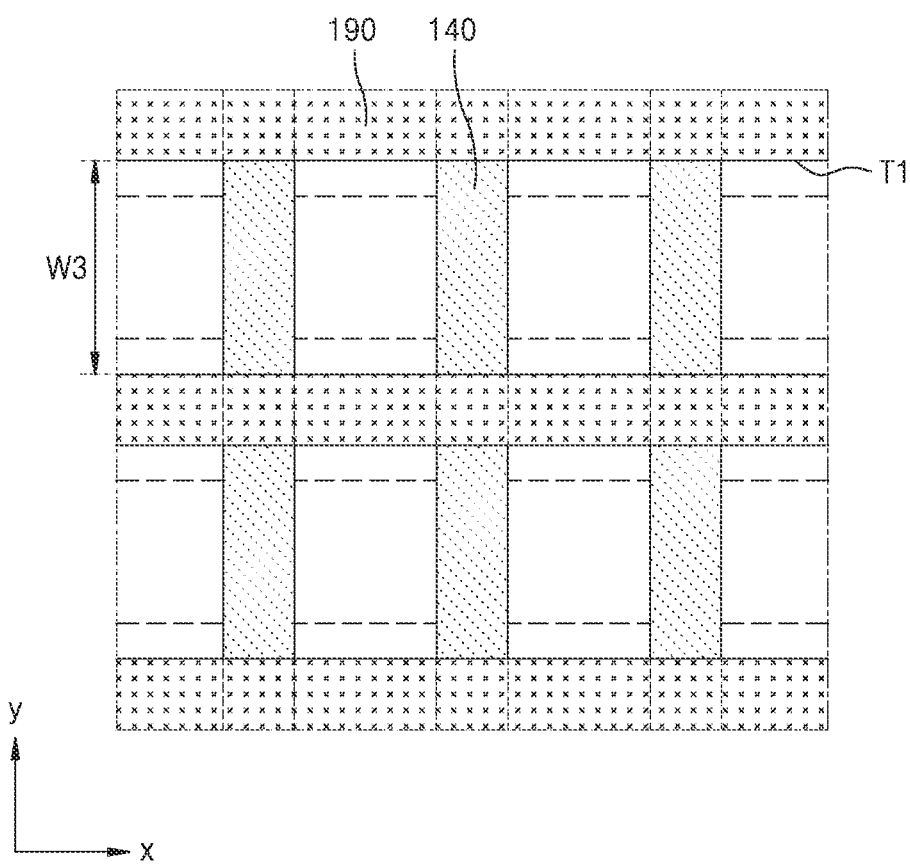
FIGS. 4A, 4B, 5, 6A, 6B, 7A, 7B, 8, 9A and 9B (hereafter collectively, "FIGS. 4A to 9B") are plan views illustrating a method of manufacture for the semiconductor device of FIG. 1A in the context of a comparative method of manufacture.
Figure 4B:
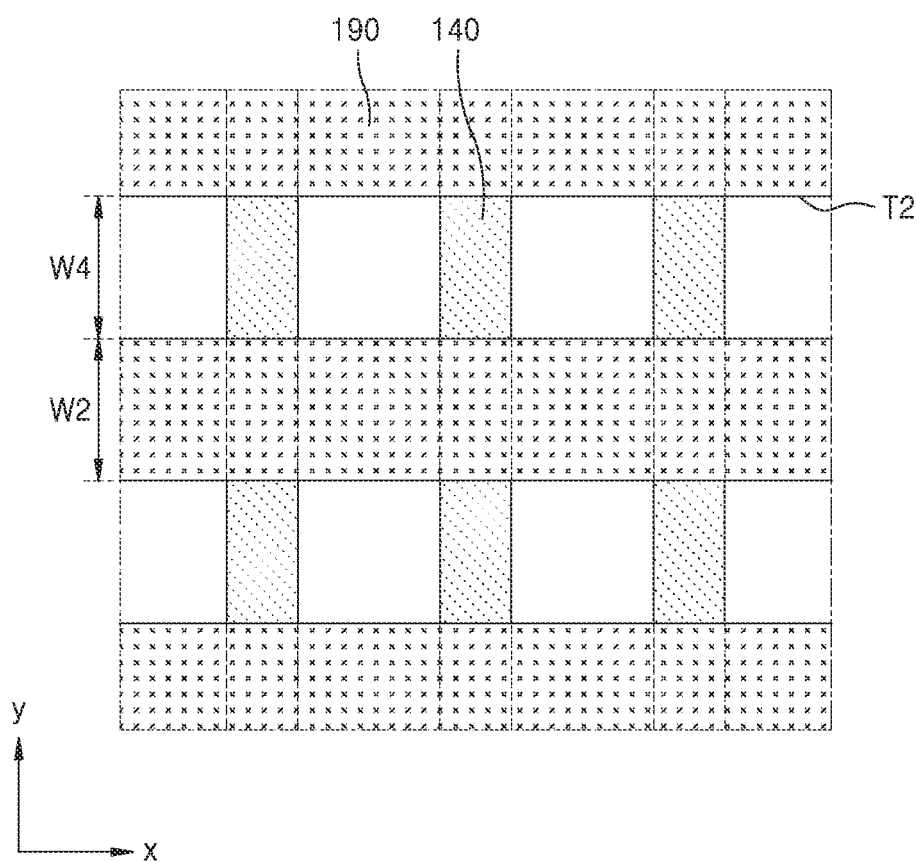

Referring to FIGS. 4A and 4B, in the method of manufacture for the semiconductor device 100, the active region 116 and the word line 124 may be formed in the substrate 110, and the bit line structures 140 may be formed above the substrate 110. Thereafter, a mold sacrificial film 190, which fills between the bit line structures 140 and covers the bit line structures 140, may be formed above the substrate 110. Thereafter, a first trench T1 having a third width W3 in the second direction may be formed by patterning the mold sacrificial film 190. When the first trench T1 is formed, the buried insulating film 126 may be exposed in the bottom surface of the first trench T1, and the top surfaces of the bit line structures 140 may be exposed.

In the method of manufacture for the comparative semiconductor device, a second trench T2 having a fourth width W4 in the second direction is formed in the mold sacrificial film 190 through the same processes as those described above with respect to the semiconductor device 100. The third width W3 may be greater than the fourth width W4. Thus, in FIG. 4A, the dashed lines in the first trench T1 may correspond to the fourth width W4 of the second trench T2. In the comparative semiconductor device, the mold sacrificial film 190 remaining after the second trench T2 is formed may have a second width W2 in the second direction. The second width W2 may be substantially the same as the fourth width W4. In some embodiments, the second width W2 may be different from the fourth width W4.

The mold sacrificial film 190 may include an oxide film or a spin-on-hardmask (SOH). Here, the SOH may refer to a material, which includes a hydrocarbon compound or a derivative of the hydrocarbon compound and has a relatively high carbon content of about 85 wt % to about 99 wt % based on the total weight thereof. The mold sacrificial film 190 may be removed by ashing and stripping. Accordingly, the mold sacrificial film 190 may be removed using only ashing and stripping without a separate etching process. The mold sacrificial film 190 may include an amorphous carbon layer (ACL) instead of the SOH.

Figure 5:
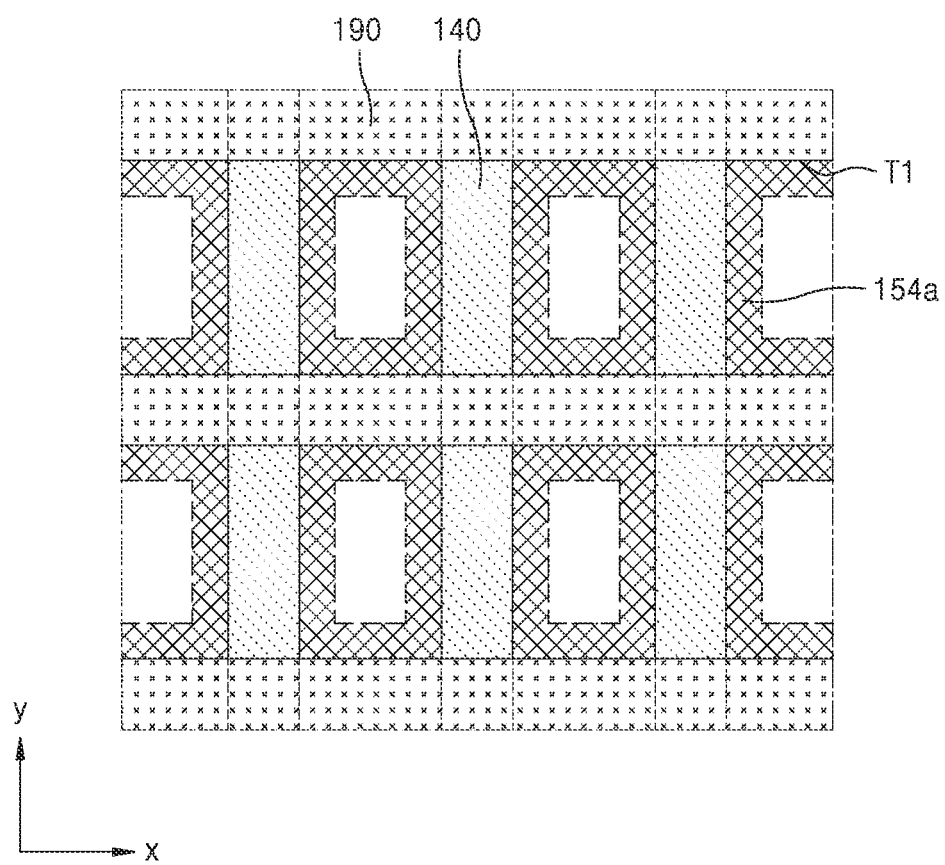

Referring to FIG. 5, in the method of manufacture for the semiconductor device 100, after the first trench T1 is formed, a carbon-containing insulating film 154a may be formed to a certain thickness on the bottom surface and side wall of the first trench T1. For example, the carbon-containing insulating film 154a may include an SiOC film or an SiOCN film. Although FIG. 5 shows the carbon-containing insulating film 154a being formed only within the first trench T1, the carbon-containing insulating film 154a may actually be formed on the top surface of a bit line structures 140 and the top surface of the mold sacrificial film 190.

In the method of manufacture for the comparative semiconductor device, there is no process of forming a carbon-containing insulating film.

Figure 6A:
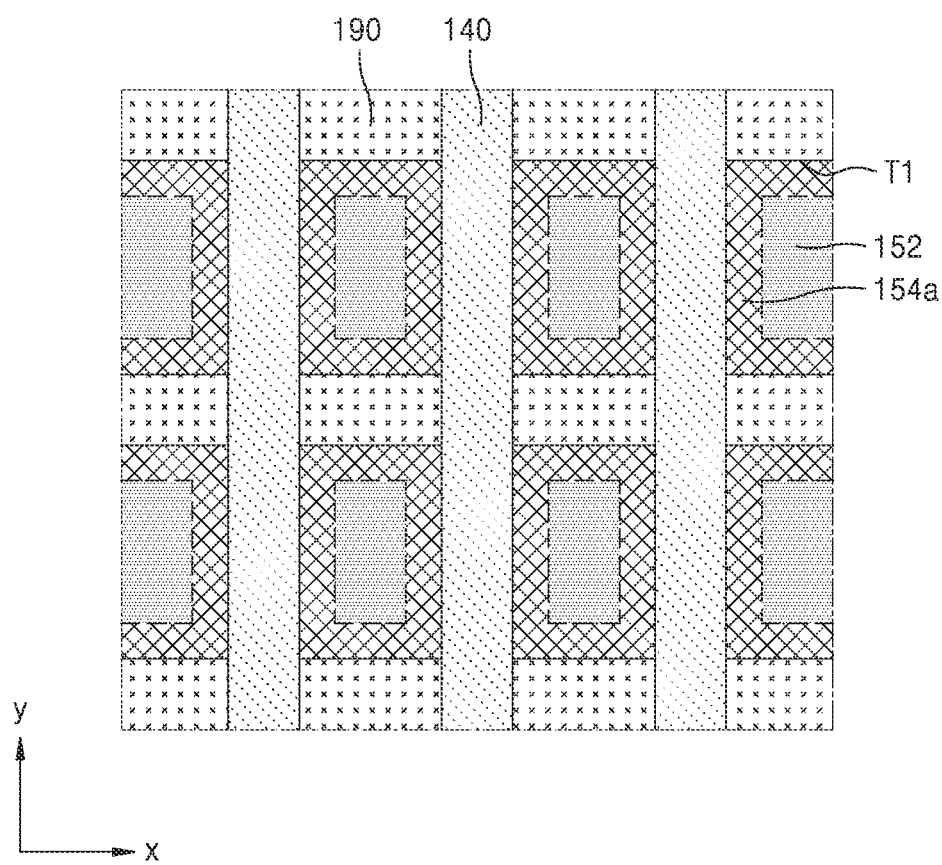
Figure 6B:
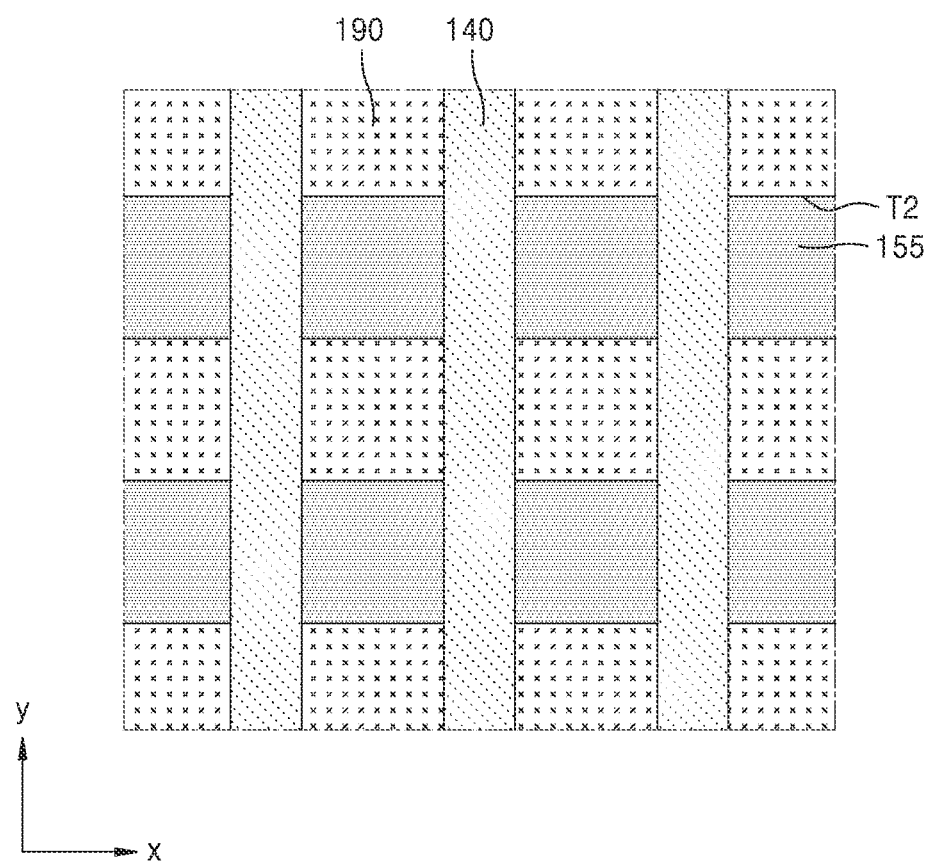

Referring to FIGS. 6A and 6B, in the method of manufacture for the semiconductor device 100, an SiN film may be formed that fills the remaining portion of the first trench T1 after the carbon-containing insulating film 154a is formed. The SiN film may be formed on the carbon-containing insulating film 154a in the first trench T1 to fill the first trench T1. The SiN film may also be formed on the carbon-containing insulating film 154a, which is on the top surfaces of the bit line structures 140 and the mold sacrificial film 190. Thereafter, a planarization process may be performed by partially removing the carbon-containing insulating film 154a and the SiN film such that the top surfaces of the bit line structures 140 are exposed. For example, the planarization process may be carried out by an etch back or a chemical-mechanical polishing (CMP) process. After the planarization process, the carbon-containing insulating film 154a and the SiN film may be only within the first trench T1. The SiN film remaining within the first trench T1 may correspond to the center fence 152.

In the method of manufacture for the comparative semiconductor device, an SiN film is formed that fills the second trench T2. The SiN film fills the second trench T2 and is formed on the top surfaces of the bit line structures 140 and the mold sacrificial film 190. Thereafter, a planarization process is formed by partially removing the SiN film such that the top surfaces of the bit line structures 140 are exposed. For example, the planarization process may be carried out by an etch back or a CMP process. After the planarization process, the SiN film may be only within the second trench T2. The SiN film remaining within the second trench T2 may correspond to a contact fence 155 of the comparative semiconductor device.

Figure 7A:
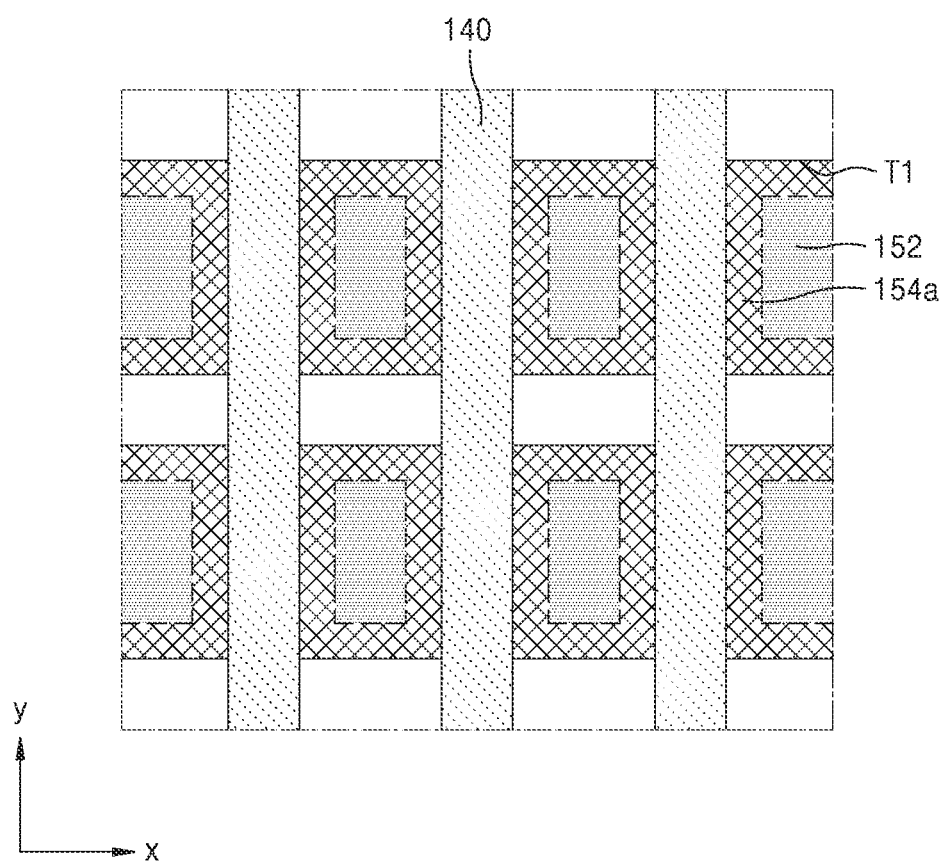
Figure 7B:
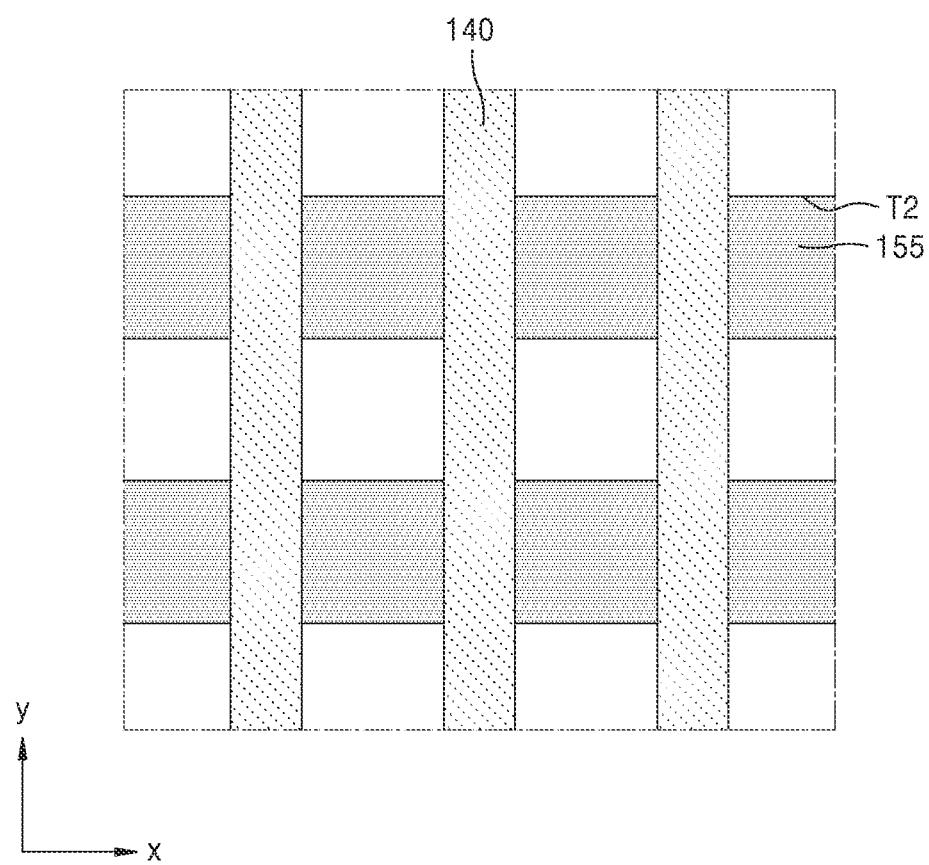

Referring to FIGS. 7A and 7B, in the method of manufacture for the semiconductor device 100, the mold sacrificial film 190 is removed after the planarization process. For example, when the mold sacrificial film 190 includes an SOH, the mold sacrificial film 190 may be removed by an ashing process. When the mold sacrificial film 190 includes an oxide film, the mold sacrificial film 190 may be removed by a wet etch. Through the removal of the mold sacrificial film 190 and/or an additional etching process, the top surface of the substrate 110 (e.g., the active region 116) may be exposed. The top surface of the active region 116 may be exposed by removing an insulating film from the top surface of the active region 116 using an additional etching process after the mold sacrificial film 190 is removed. Here, the additional etching process may include a dry etch. In some embodiments, before the mold sacrificial film 190 is formed, the insulating film on the top surface of the active region 116 may be removed. In this case, the top surface of the active region 116 may be exposed by only removing the mold sacrificial film 190.

In the method of manufacture for the comparative semiconductor device, the mold sacrificial film 190 is removed after the planarization process. Through the removal of the mold sacrificial film 190 and/or an additional etching process, the top surface of active region 116 may be exposed.

Figure 8:
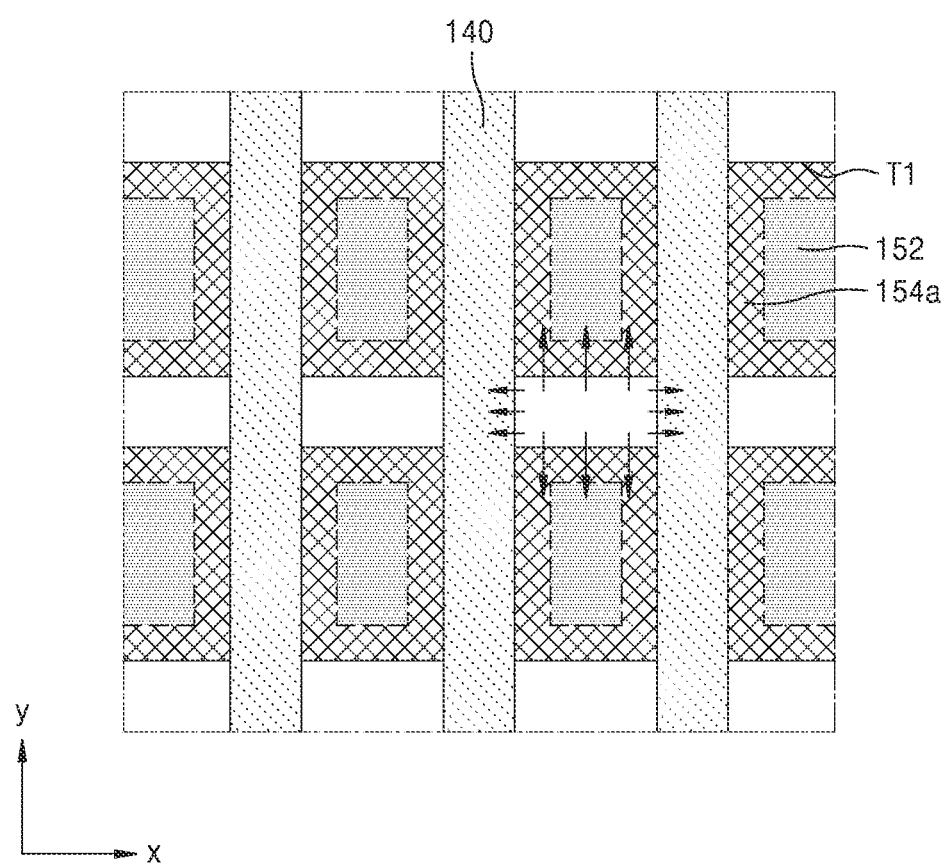

Referring to FIG. 8, in the method of manufacture for the semiconductor device 100, after the mold sacrificial film 190 is removed, the carbon-containing insulating film 154*a* may be partially removed. As described above, the spacer 147 may be arranged in the outermost portion of a bit line structure 140 and may include, for example, an SiN film. Accordingly, the carbon-containing insulating film 154*a* may be partially removed using an etchant having an etch selectivity with respect to the SiN film. In FIG. 8, a length difference between indicated arrows may represent an etch rate difference. Accordingly, the carbon-containing insulating film 154*a* may be etched to a certain depth (e.g., to the center fence 152) with a minimum etching depth with respect to the spacer 147 of the bit line structure 140.

The process of partially removing the carbon-containing insulating film 154*a* may be carried out using various methods. Firstly, a portion of the carbon-containing insulating film 154*a* may be removed in the process of removing the mold sacrificial film 190 described above. For example, when the mold sacrificial film 190 includes an SOH and is removed by ashing, a portion of the carbon-containing insulating film 154*a* may also be removed. Secondly, a portion of the carbon-containing insulating film 154*a* may be removed using a separate ashing process or wet etch. Thirdly, when the insulating film is removed from the top surface of the active region 116 using the additional etching process, a portion of the carbon-containing insulating film 154*a* may be removed using an etch selectivity.

In the case of the method of manufacture for the comparative semiconductor device, there is no process of partially removing a carbon-containing insulating film because the comparative semiconductor device does not include a carbon-containing insulating film.

Figure 9A:
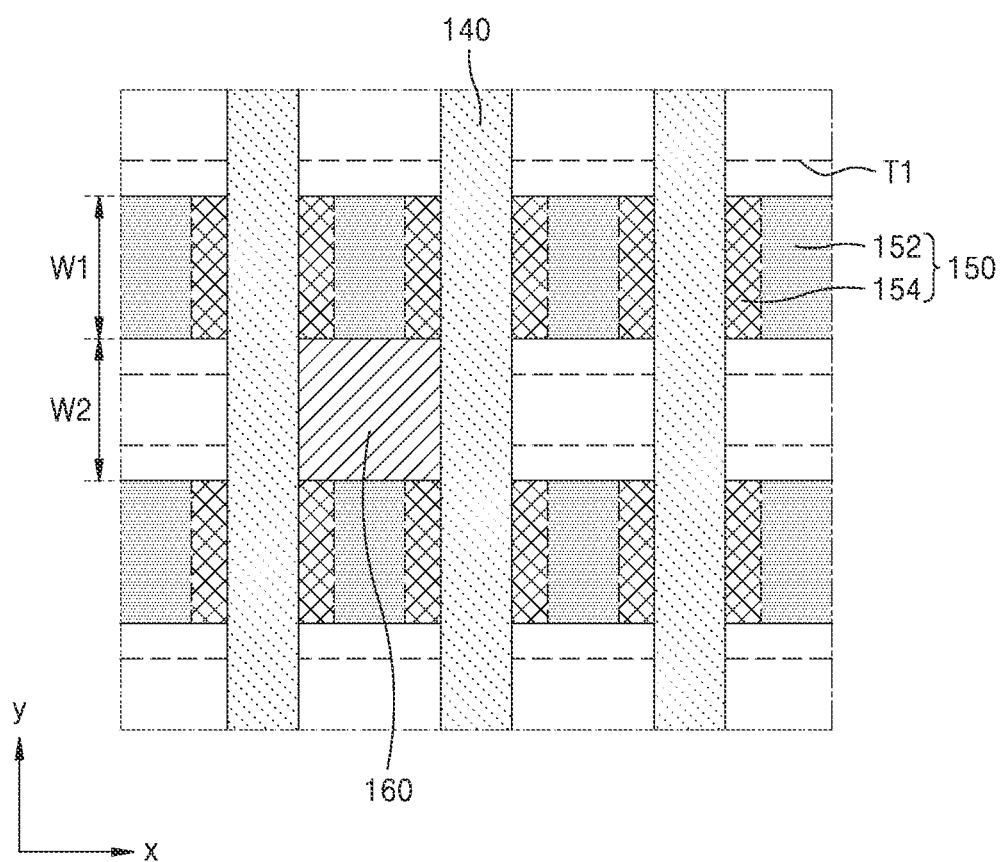
Figure 9B:
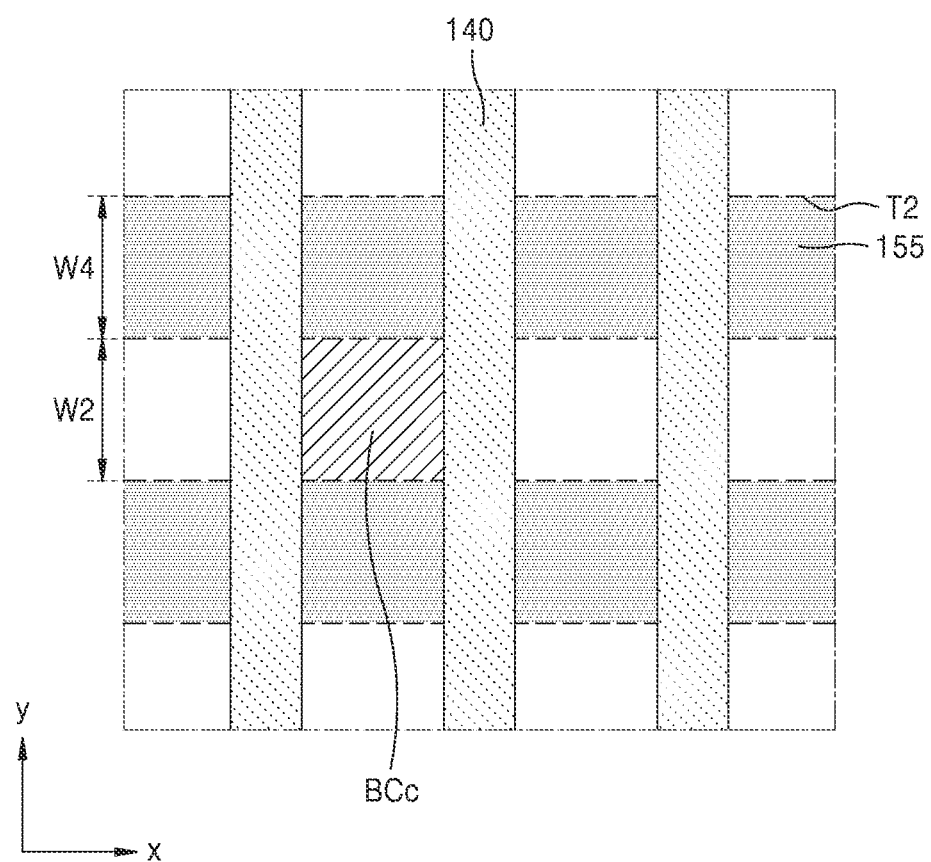

Referring to FIGS. 9A and 9B, in the method of manufacture for the semiconductor device 100, after a portion of the carbon-containing insulating film 154*a* is removed, a portion from which the mold sacrificial film 190 and the portion of the carbon-containing insulating film 154*a* are removed may be filled with a conductive film (e.g., a polysilicon film), thereby forming the buried contact 160. In the semiconductor device 100, a contact fence 150 including the center fence 152 and the outer fence 154 may be completely formed when the outer fence 154 is formed by partially removing the carbon-containing insulating film 154*a*. The contact fence 150 may have the first width W1 in the second direction, and the buried contact 160 may have the second width W2 in the second direction. In FIG. 9A, dashed lines indicate borders of the carbon-containing insulating film 154*a* before being partially removed.

In the case of the method of manufacture for the comparative semiconductor device, a portion from which the mold sacrificial film 190 is removed is filled with a conductive film, thereby forming a buried contact BCc. The contact fence 155 may have the fourth width W4 in the second direction, and the buried contact BCc may have the second width W2 in the second direction. The second width W2 may be substantially the same as the fourth width W4. Although each of the buried contacts 160 and BCc is formed in every portion from which the mold sacrificial film 190 is removed, only one portion is marked with hatches in FIGS. 9A and 9B, for convenience of comparison.

In the method of manufacture for the semiconductor device 100, an etching process may be readily performed while forming the buried contact 160 in the same size as the buried contact BCc of the comparative semiconductor device, by using the carbon-containing insulating film 154*a*. For example, because the first trench T1 is formed to have the third width W3 that is greater than the fourth width W4, the first trench T1 may be formed more readily than the second trench T2 of the comparative semiconductor device. The buried contact BCc of the comparative semiconductor device and the buried contact 160 of the semiconductor device 100 have the second width W2 in the second direction and thus have substantially the same size as each other.

When the first trench T1 is formed to have the same width as the second trench T2, the buried contact 160 of the semiconductor device 100 may be larger than the buried contact BCc of the comparative semiconductor device because of an etch using the carbon-containing insulating film 154*a*. In this case, the buried contact 160 may be formed with a larger size with approximately the same degree of difficulty with an etching process, as compared with the comparative semiconductor device. And as a further result, the resistance characteristic of the buried contact 160 may be improved.

FIGS. 10 to 14 are plan views illustrating a method of manufacture for the semiconductor device 100B of FIG. 3B in the context of FIGS. 4B, 6B, 7B, and 9B.

Figure 10:
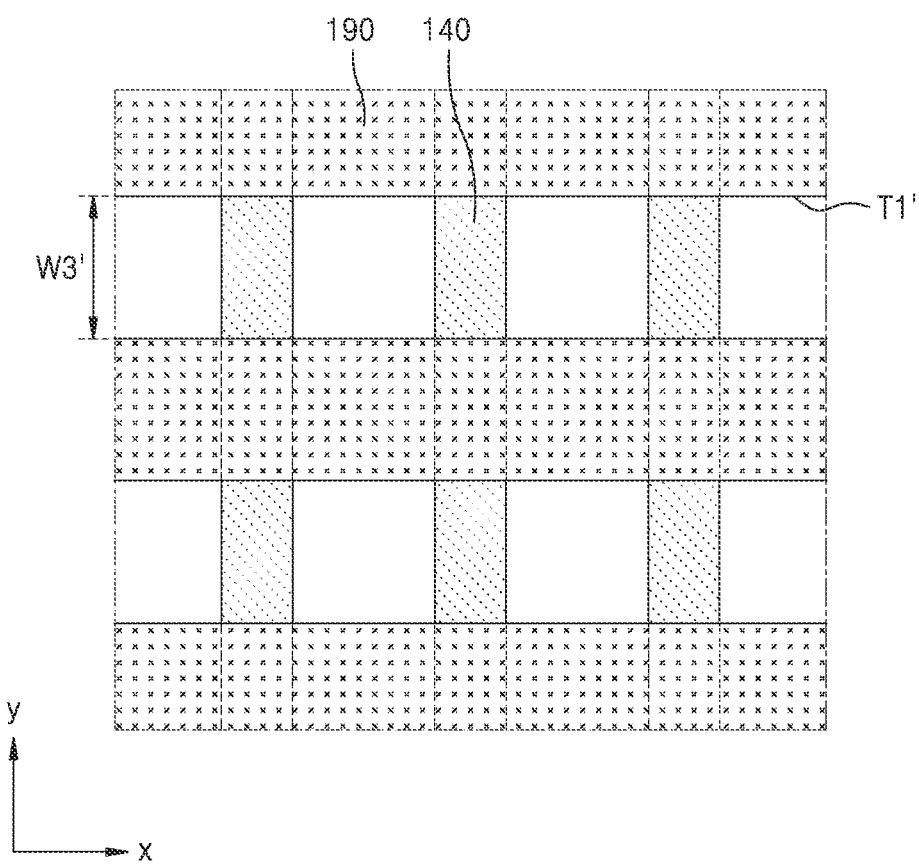
FIGS. 10, 11, 12, 13 and 14 (hereafter collectively, "FIGS. 10 to 14") are related plan views illustrating a method of manufacture for the semiconductor device of FIG. 3B.

Referring to FIG. 10, in the method of manufacture for the semiconductor device 100*b*, the mold sacrificial film 190, which fills between the bit line structures 140 and covers the bit line structures 140, may be formed above the substrate 110. Thereafter, a first trench T1' having a third width W3' in the second direction may be formed by patterning the mold sacrificial film 190. When the first trench T1' is formed, the buried insulating film 126 may be exposed in the bottom surface of the first trench T1', and the top surfaces of the bit line structures 140 may be exposed.

In the method of manufacture for the comparative semiconductor device of FIG. 4B, the second trench T2 having the fourth width W4 in the second direction is formed in the mold sacrificial film 190 through the same processes as those described above with respect to the semiconductor device 100*b*. The fourth width W4 may be substantially the same as the second width W2 of the mold sacrificial film 190 that remains after the second trench T2 is formed. Also, the fourth width W4 may be substantially the same as the third width W3'.

Figure 11:
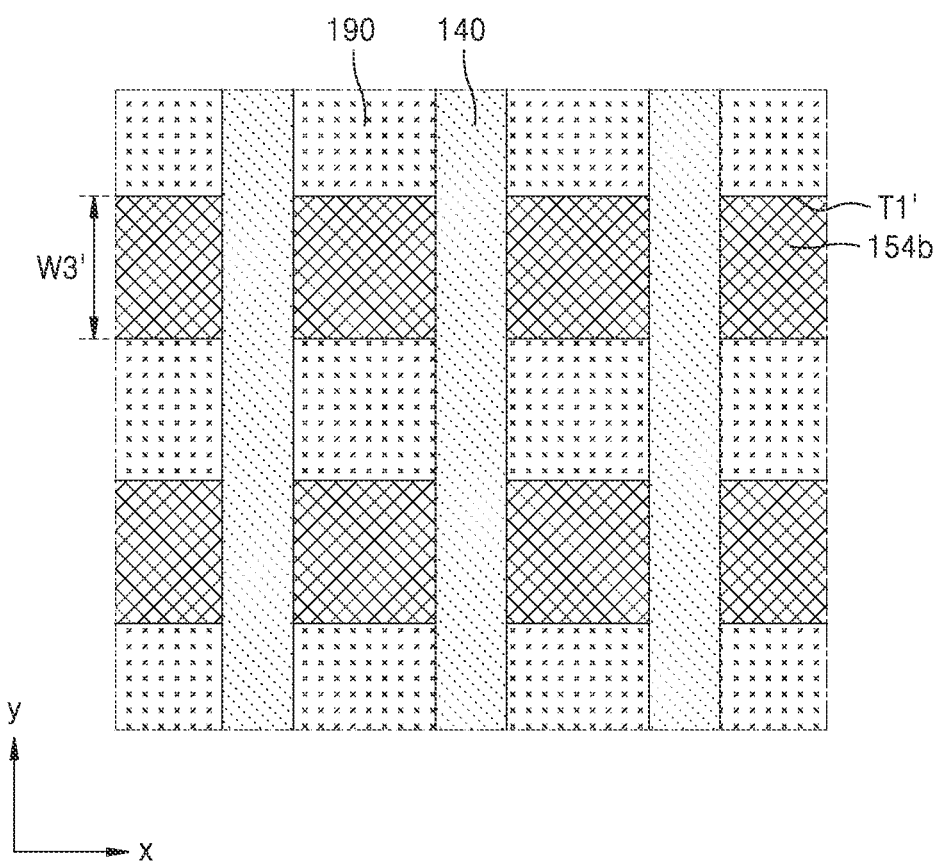

Referring to FIG. 11, in the method of manufacture for the semiconductor device 100*b*, a carbon-containing insulating film 154*b* filling the first trench T1' may be formed. That is, the carbon-containing insulating film 154*b* may be formed in the first trench T1' to fill the first trench T1'. The carbon-containing insulating film 154*b* may also be formed on the top surfaces of the bit line structures 140 and the top surface of the mold sacrificial film 190. Thereafter, a planarization process may be performed by partially removing the carbon-containing insulating film 154*b* such that the top surfaces of the bit line structures 140 are exposed. For example, the planarization process may be carried out by an etch back or a CMP process. After the planarization process, the carbon-containing insulating film 154*b* may be only within the first trench T1'.

In the method of manufacture for the comparative semiconductor device of FIG. 6B, an SiN film filling the second trench T2 is formed. The SiN film fills the second trench T2 and is formed on the top surfaces of the bit line BL and the mold sacrificial film 190. Thereafter, a planarization process is formed by partially removing the SiN film such that the top surfaces of the bit line structures 140 are exposed. For example, the planarization process may be carried out by an etch back or a CMP process. After the planarization process, the SiN film may be only within the second trench T2. The SiN film remaining within the second trench T2 may correspond to the contact fence 155 of the comparative semiconductor device.

Figure 12:
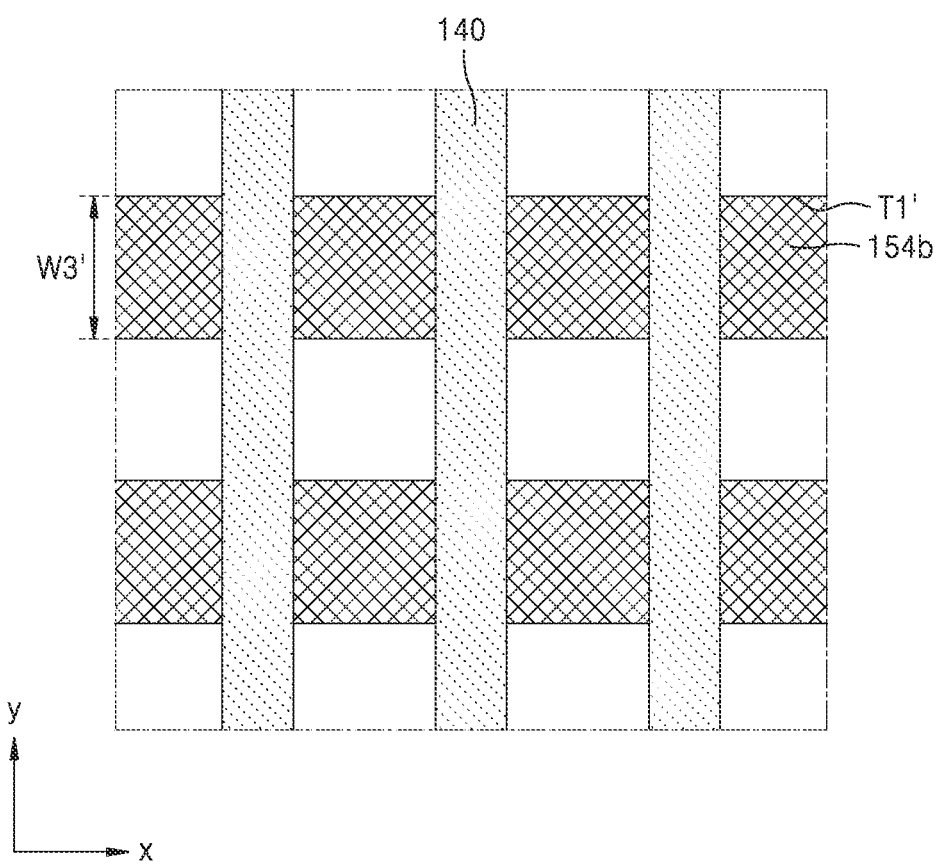

Referring to FIG. 12, in the method of manufacture for the semiconductor device 100b, the mold sacrificial film 190 is removed after the planarization process. For example, the mold sacrificial film 190 may be removed by an ashing process or a wet etch. Through the removal of the mold sacrificial film 190 and/or an additional etching process, the top surface of the substrate 110 (e.g., the active region 116) may be exposed. In some embodiments, before the mold sacrificial film 190 is formed, the insulating film on the top surface of the active region 116 may be removed.

In the method of manufacture for the comparative semiconductor device of FIG. 7B, the mold sacrificial film 190 is removed after the planarization process. Through the removal of the mold sacrificial film 190 and/or an additional etching process, the top surface of the substrate 110 (e.g., the active region 116) may be exposed.

Figure 13:
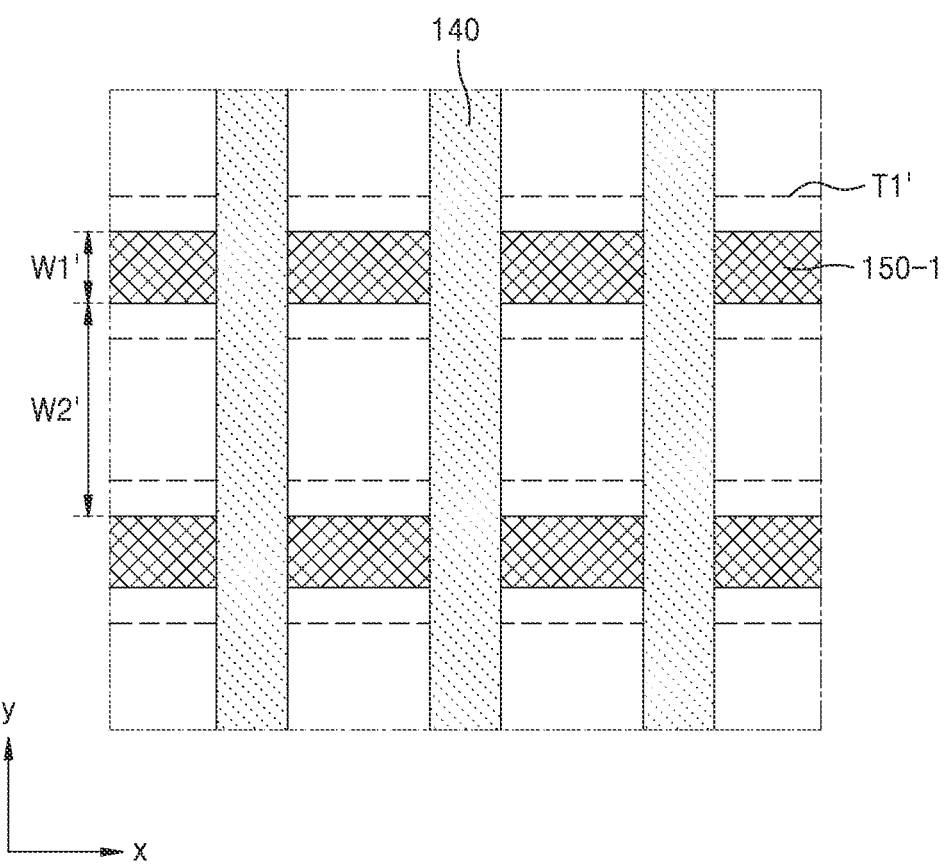

Referring to FIG. 13, in the method of manufacture for the semiconductor device 100b, after the mold sacrificial film 190 is removed, the carbon-containing insulating film 154b may be partially removed. The carbon-containing insulating film 154b may be partially removed using one of three methods described below. Firstly, a portion of the carbon-containing insulating film 154b may be removed in the process of removing the mold sacrificial film 190. Secondly, a portion of the carbon-containing insulating film 154b may be removed using a separate ashing process or wet etch. Thirdly, when the insulating film is removed from the top surface of the active region 116 using an additional etching process, a portion of the carbon-containing insulating film 154b may be removed using an etch selectivity.

In the method of manufacture for the comparative semiconductor device, there is no process of partially removing a carbon-containing insulating film because the comparative semiconductor device does not include a carbon-containing insulating film.

Figure 14:
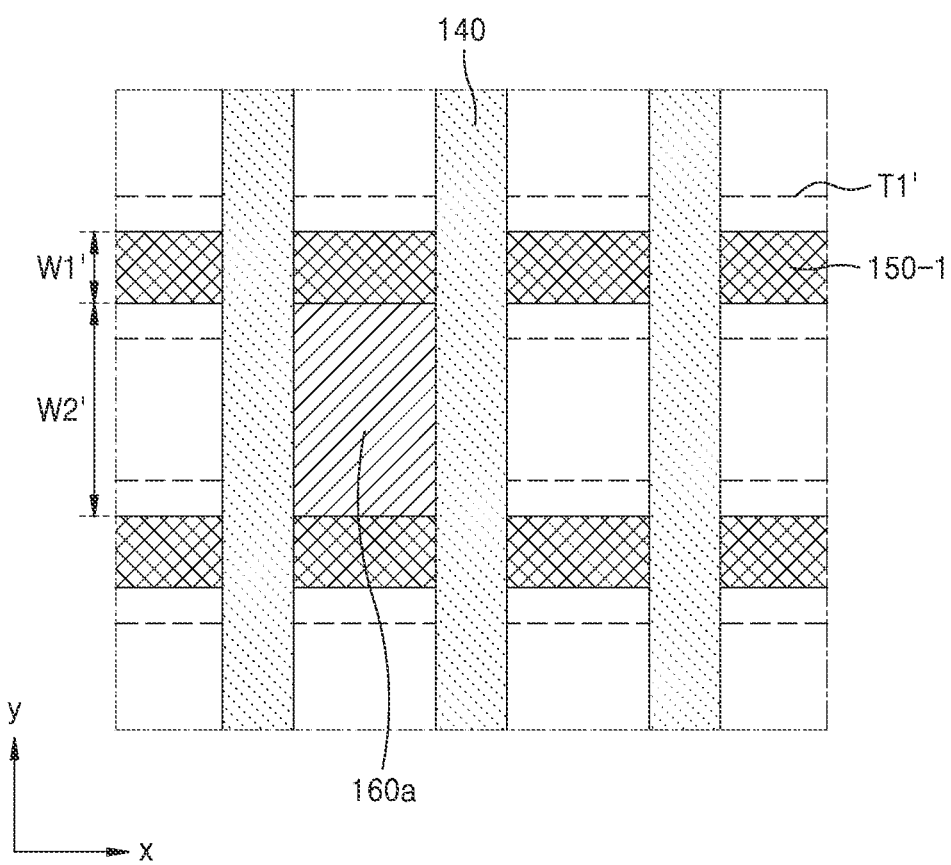

Referring to FIG. 14, in the method of manufacture for the semiconductor device 100b, after a portion of the carbon-containing insulating film 154b is removed, a portion from which the mold sacrificial film 190 and the portion of the carbon-containing insulating film 154b are removed may be filled with a conductive film (e.g., a polysilicon film), thereby forming the buried contact 160a. In the semiconductor device 100b, a contact fence 150-1 or a contact fence Fce2 may be completely formed by partially removing the carbon-containing insulating film 154b. The contact fence 150-1 may have the first width W1' in the second direction, and the buried contact 160a may have the second width W2' in the second direction. The second width W2' may be greater than the first width W1'. In FIG. 14, dashed lines indicate borders of the carbon-containing insulating film 154b before being partially removed.

In the method of manufacture for the comparative semiconductor device of FIG. 9B, a portion from which the mold sacrificial film 190 is removed is filled with a conductive film, thereby forming the buried contact BCc. The buried contact BCc may have the second width W2 in the second direction, and the contact fence 155 may have the fourth width W4 in the second direction. The second width W2 may be substantially the same as the fourth width W4. Although each of the buried contacts 160a and BCc is formed in every portion from which the mold sacrificial film 190 is removed, only one portion is marked with hatches in FIGS. 14 and 9B, for convenience of comparison.

In the method of manufacture for the semiconductor device 100b, while a trench having the same width as a trench of the comparative semiconductor device is formed, the buried contact 160a that is bigger than the buried contact BCc of the comparative semiconductor device may be formed by using the carbon-containing insulating film 154b. Accordingly, the resistance characteristic of the buried contact 160a may be improved.

When the first trench T1' is formed to be larger than the second trench T2 and the buried contact 160a is formed by partially etching the carbon-containing insulating film 154b, the size of the buried contact 160a may be substantially the same as that of the buried contact BCc of the comparative semiconductor device. In this case, because the first trench T1' has a relatively larger width, an etching process may be more readily performed. When the first trench T1' is formed to be relatively larger and the buried contact 160a has substantially the same size as the buried contact BCc of the comparative semiconductor device, the semiconductor device 100a of FIG. 3A may be obtained.

Figure 16A:
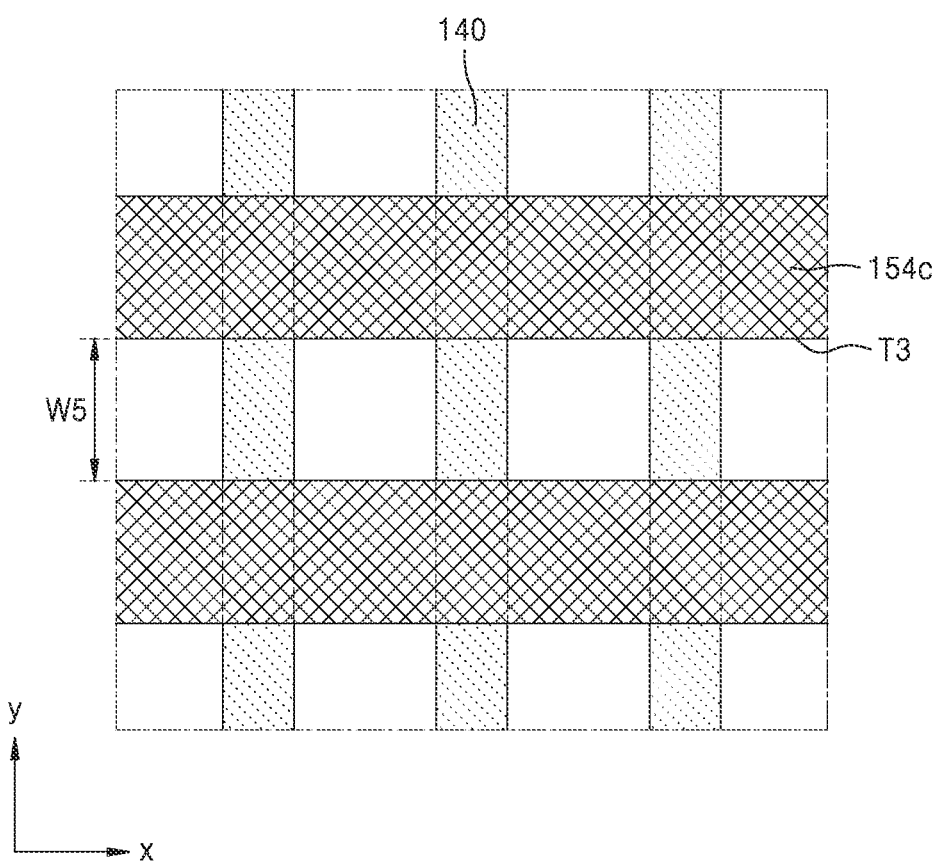
Figure 16B:
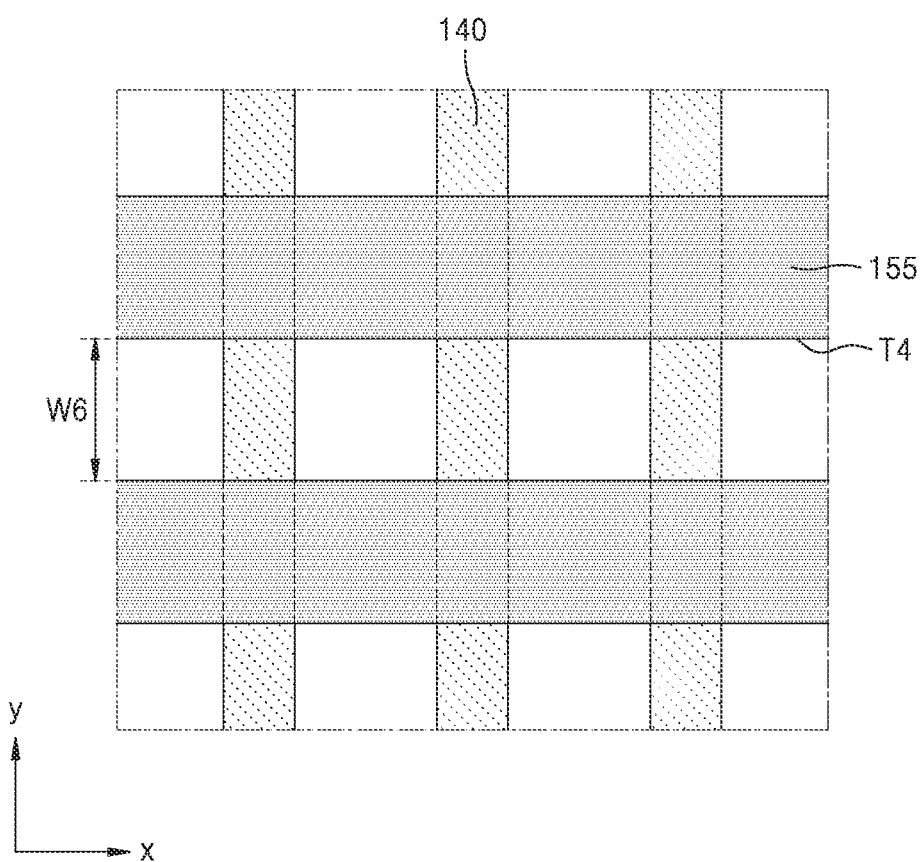
Figure 17:
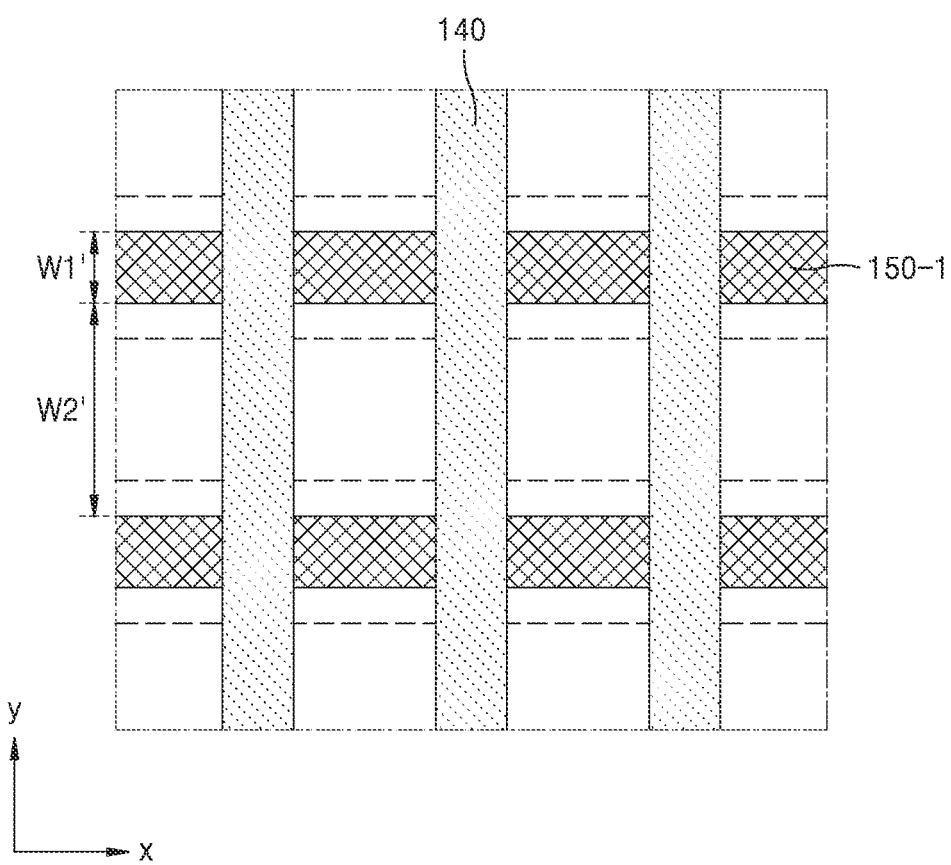
Figure 18A:
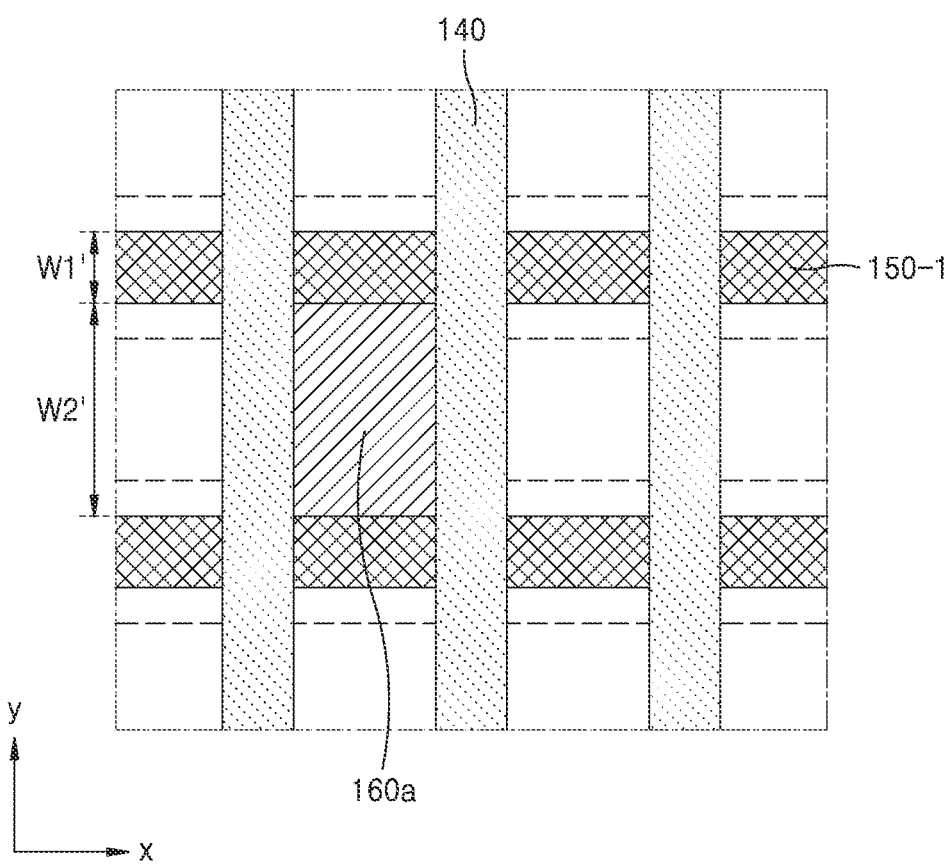
Figure 18B:
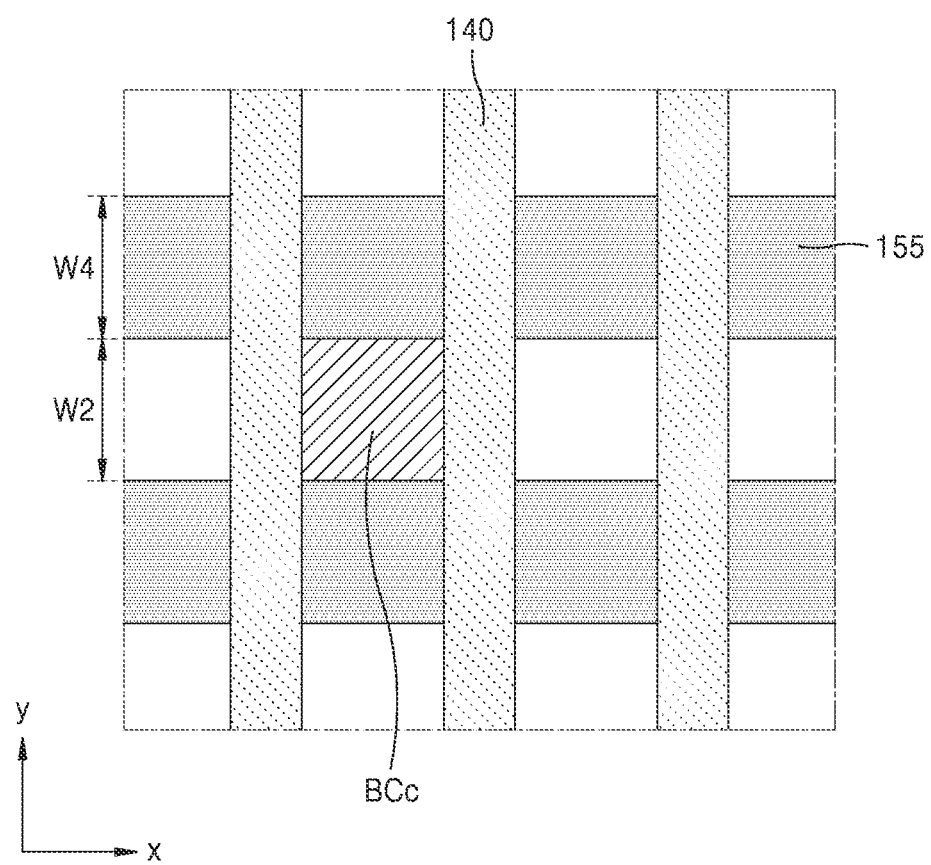

FIGS. 15A to 18B are plan views illustrating a method of manufacture for the semiconductor device 100b of FIG. 3B and a method of manufacture for the comparative semiconductor device. Here, FIGS. 15A, 16A, 17, and 18A are plan views illustrating the method of manufacture for the semiconductor device 100b of FIG. 3B, whereas FIGS. 15B, 16B, and 18B are plan views illustrating a method of manufacture for the comparative semiconductor device.

Figure 15A:
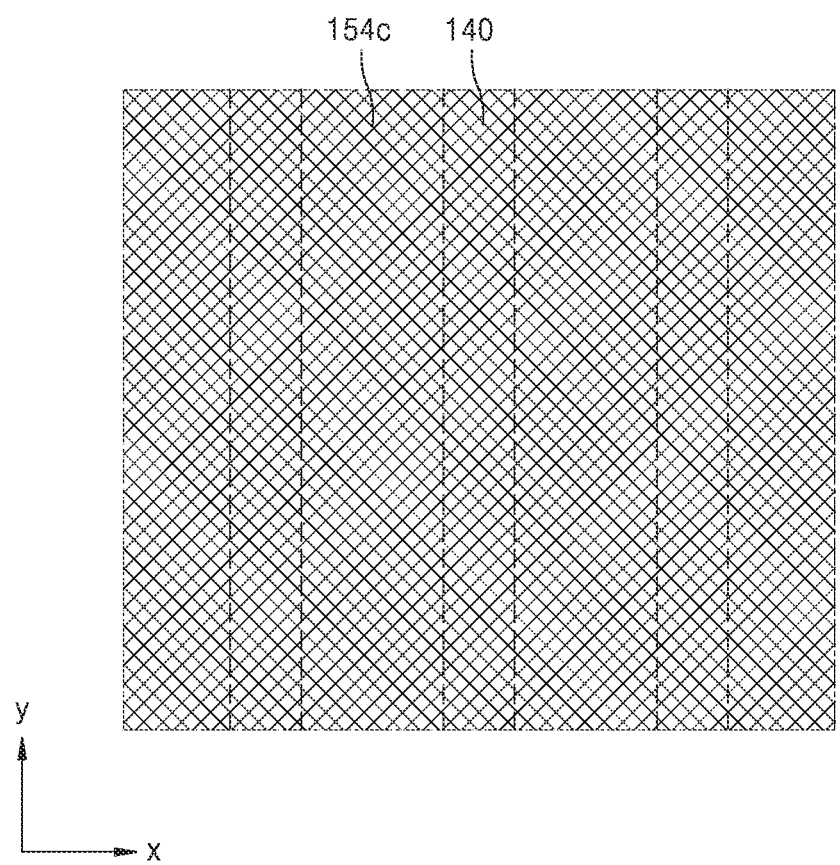
FIGS. 15A, 15B, 16A, 16B, 17, 18A and 18B (hereafter collectively, "FIGS. 15A to 18B") are related plan views illustrating a method of manufacture for the semiconductor device of FIG. 3B in the context of a comparative method of manufacture.
Figure 15B:
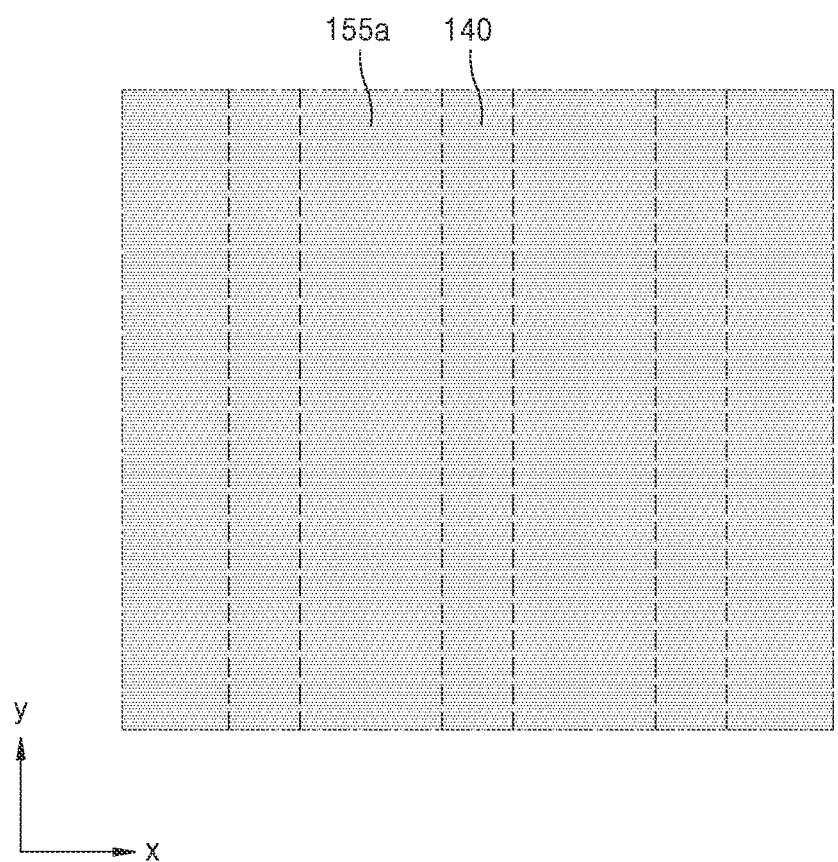

Referring to FIGS. 15A and 15B, in the method of manufacture for the semiconductor device 100b, a carbon-containing insulating film 154c, which fills between the bit line structures 140 and covers the bit line structures 140, may be formed above the substrate 110. Before the carbon-containing insulating film 154c is formed, a process of removing the insulating film on the top surface of the substrate 110 (e.g., the active region 116) may be performed. In the process of removing the insulating film on the top surface of the active region 116, an upper portion of the buried insulating film 126 on the word line 124 may be removed.

In the method of manufacture for the comparative semiconductor device, an SiN film 155a, which fills between the bit line structures 140 and covers the bit line structures 140, is formed above the substrate 110 through the same processes as those described above with respect to the semiconductor device 100b.

Referring to FIGS. 16A and 16B, in the method of manufacture for the semiconductor device 100b, after the carbon-containing insulating film 154c is formed, a third trench T3 having a fifth width W5 in the second direction may be formed by patterning the carbon-containing insulating film 154c. When the third trench T3 is formed, the top surface of the active region 116 may be exposed in the bottom surface of the third trench T3, and the top surface of a bit line structure 140 may also be exposed.

In the method of manufacture for the comparative semiconductor device, a fourth trench T4 having a sixth width W6 in the second direction is formed in the SiN film 155a through the same process as that described above with respect to the semiconductor device 100b. The sixth width W6 may be substantially the same as the fourth width W4 of the SiN film 155 that remains after the fourth trench T4 is formed.

Referring to FIG. 17, in the method of manufacture for the semiconductor device 100b, after the third trench T3 is formed, a process of additionally removing a portion of the carbon-containing insulating film 154c may be performed. The process of additionally removing a portion of the carbon-containing insulating film 154c may be carried out using two methods described below. Firstly, in the process of forming the third trench T3, a portion of the carbon-containing insulating film 154c may also be removed. Secondly, after the third trench T3 is formed, a portion of the carbon-containing insulating film 154c may be removed using a separate ashing process or wet etch.

In the method of manufacture for the comparative semiconductor device, there is no process of removing a portion of a carbon-containing insulating film because the comparative semiconductor device does not include a carbon-containing insulating film.

Referring to FIGS. 18A and 18B, in the method of manufacture for the semiconductor device 100b, after a portion of the carbon-containing insulating film 154c is additionally removed, a portion from which the carbon-containing insulating film 154c is removed may be filled with a conductive film, thereby forming the buried contact 160a. Thus, in the semiconductor device 100b, the contact fence 150-1 or the contact fence Fce2 may be completely formed by partially removing the carbon-containing insulating film 154c. The contact fence 150-1 may have the first width W1' in the second direction, and the buried contact 160a may have the second width W2' in the second direction. The second width W2' may be greater than the first width W1'. In FIG. 18A, dashed lines indicate borders of the carbon-containing insulating film 154c before being partially removed.

In the method of manufacture for the comparative semiconductor device, a portion from which the SiN film 155a is removed is filled with a conductive film, thereby forming the buried contact BCc. The buried contact BCc may have the second width W2 in the second direction, and the contact fence 155 may have the fourth width W4 in the second direction. The second width W2 may be substantially the same as the fourth width W4. Although each of the buried contacts 160a and BCc is formed in every portion from which the carbon-containing insulating film 154c and the SiN film 155a is removed, only one portion is marked with hatches in FIGS. 18A and 18B, for convenience of comparison.

The contact fence 150-1 of the semiconductor device 100b of an embodiment and the contact fence 155 of the comparative semiconductor device may be formed in an embossed structure. The semiconductor device 100b manufactured (e.g.,) using the method of FIGS. 10 to 14 may be formed in an engraved structure. Except for the difference between the embossed structure and the engraved structure, the contact fence 150-1 and the buried contact 160a in FIG. 18A may be substantially the same as the contact fence 150-1 and the buried contact 160a of the semiconductor device 100b of FIG. 14. In the method of manufacture for the semiconductor device 100b of FIG. 3B, while a trench having the same width as the trench of the comparative semiconductor device may be formed, the buried contact 160a may nonetheless be larger than the buried contact BCc of the comparative semiconductor device by use of the carbon-containing insulating film 154c. Accordingly, the resistance characteristic of the buried contact 160a may be improved.

While the inventive concept has been particularly shown and described with reference to embodiments thereof, it will be understood that various changes in form and details may be made therein without departing from the spirit and scope of the following claims.

What is claimed is:

1. A semiconductor device comprising:
an active region defined by an isolation film on a substrate;
a word line in the substrate, the word line extending in a first direction and crossing the active region;
a bit line above the word line and extending in a second direction;
a contact between bit lines adjacent in the first direction, the contact connecting to the active region and extending in a vertical direction; and
a contact fence disposed on each of opposing side surfaces of the contact in the second direction and extending in the vertical direction,
wherein the contact fence has a step in a portion corresponding to a top surface of the contact,
wherein the active region has a bar shape extending oblique to the first direction, and
wherein the contact fence includes a carbon-containing insulating film.

2. The semiconductor device of claim 1, wherein a horizontal cross-section of the contact fence has a rectangular shape, and
an entirety of the contact fence includes the carbon-containing insulating film.

3. The semiconductor device of claim 2, wherein, when a trench for formation of the contact fence has substantially a same width in the second direction as a sacrificial film in an outer portion of the trench,
the contact fence is formed by filling the trench with the carbon-containing insulating film,
the contact is formed by filling a conductive film in a portion from which the sacrificial film and a portion of the carbon-containing insulating film are removed, and
a width of the contact is greater than a width of the contact fence in the second direction.

4. The semiconductor device of claim 1, wherein a horizontal cross-section of the contact fence has a rectangular shape,
the contact fence includes a center fence including a silicon nitride (SiN) film and an outer fence including the carbon-containing insulating film, and
the outer fence is disposed on each of opposing side surfaces of the center fence in the first direction.

5. The semiconductor device of claim 4, wherein, when a trench for formation of the contact fence has a greater width in the second direction than a sacrificial film in an outer portion of the trench,
the contact fence is formed by filling the trench with the SiN film and the carbon-containing insulating film,
the contact is formed by filling a conductive film in a portion from which the sacrificial film and a portion of the carbon-containing insulating film are removed, and
a width of the contact is substantially same as a width of the contact fence in the second direction.

6. The semiconductor device of claim 1, wherein a width of an upper portion of the contact fence above the step is greater than a width of a lower portion of the contact fence below the step in the second direction.

7. The semiconductor device of claim 1, wherein a width of an upper portion of the contact fence above the step is less than a width of a lower portion of the contact fence below the step in the second direction.

8. The semiconductor device of claim 1, wherein the contact includes a polysilicon film.

9. The semiconductor device of claim 1, wherein the carbon-containing insulating film includes at least one of silicon oxide carbon (SiOC) or silicon oxide carbon nitride (SiOCN).

10. A semiconductor device comprising:
an active region defined by an isolation film on a substrate;
a word line in the substrate, the word line extending in a first direction and crossing the active region;
a bit line disposed above the word line and extending in a second direction;
a contact between bit lines adjacent in the first direction, the contact being connected to the active region and extending in a vertical direction; and
a contact fence on each of opposing side surfaces of the contact in the second direction and extending in the vertical direction,
wherein the active region has a bar shape extending oblique to the first direction, and
the contact fence includes a center fence including a silicon nitride (SiN) film and an outer fence including a carbon-containing insulating film.

11. The semiconductor device of claim 10, wherein a horizontal cross-section of the contact fence has a rectangular shape, and
the outer fence is disposed on each of opposing side surfaces of the center fence in the first direction.

12. The semiconductor device of claim 10, wherein, when a trench for formation of the contact fence has a greater width in the second direction than a sacrificial film in an outer portion of the trench,
the contact fence is formed by filling the trench with the SiN film and the carbon-containing insulating film,
the contact is formed by filling a conductive film in a portion from which the sacrificial film and a portion of the carbon-containing insulating film are removed, and
a width of the contact is substantially same as a width of the contact fence in the second direction.

13. The semiconductor device of claim 10, wherein the contact fence has a step in a portion corresponding to a top surface of the contact.

14. The semiconductor device of claim 13, wherein the contact fence includes one of a first structure in which a width of an upper portion of the contact fence above the step is greater in the second direction than a width of a lower portion of the contact fence below the step,
a second structure in which the width of the upper portion of the contact fence above the step is less in the second direction than the width of the lower portion of the contact fence below the step, and
a third structure in which the width of the contact fence in the second direction increases upwardly in the vertical direction, or is substantially same in upper and lower portions of the contact fence.

15. A semiconductor device comprising:
an active region defined by an isolation film on a substrate;
a word line in the substrate, the word line extending in a first direction and crossing the active region;
a bit line disposed above the word line and extending in a second direction;
a contact between bit lines adjacent in the first direction, the contact being connected to the active region and extending in a vertical direction; and
a contact fence on each of opposing side surfaces of the contact in the second direction and extending in the vertical direction,
wherein the active region has a bar shape extending oblique to the first direction,
wherein the contact fence includes a carbon-containing insulating film,
wherein the contact comprises a conductive film filling a volume from which the carbon-containing insulating film has been removed, and
wherein a width of the contact is greater than a width of the contact fence in the second direction.

16. The semiconductor device of claim 15, wherein the contact fence has a step in a portion corresponding to a top surface of the contact.

17. The semiconductor device of claim 16, wherein the contact fence includes one of
a first structure in which a width of an upper portion of the contact fence above the step is greater in the second direction than a width of a lower portion of the contact fence below the step,
a second structure in which the width of the upper portion of the contact fence above the step is less in the second direction than the width of the lower portion of the contact fence below the step, and
a third structure in which the width of the contact fence in the second direction increases upwards in the vertical direction or is substantially same in upper and lower portions of the contact fence.

* * * * *